United States Patent
Kajiwara et al.

(10) Patent No.: US 6,882,144 B2
(45) Date of Patent: Apr. 19, 2005

(54) ELECTROMAGNETIC WAVE MEASURING APPARATUS AND METHOD

(75) Inventors: Shoichi Kajiwara, Moriguchi (JP); Akihiro Ozaki, Neyagawa (JP); Koichi Ogawa, Hirakata (JP); Yoshio Koyanagi, Ebina (JP); Yoshitaka Asayama, Ogasa-gun (JP); Yutaka Saito, Nomi-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/787,576

(22) Filed: Feb. 27, 2004

(65) Prior Publication Data

US 2004/0183529 A1 Sep. 23, 2004

(30) Foreign Application Priority Data

Feb. 28, 2003 (JP) ........................................ 2003-054588

(51) Int. Cl.[7] .............................................. G01R 33/00
(52) U.S. Cl. .......................... 324/247; 324/257; 324/260
(58) Field of Search ........................ 324/207.22–207.26, 324/242–244, 245, 247, 257, 260; 702/152, 153

(56) References Cited

U.S. PATENT DOCUMENTS

2003/0076094 A1 * 4/2003 Hoshino ...................... 324/247

FOREIGN PATENT DOCUMENTS

| JP | 9-304456 | 11/1997 |
|----|----------|---------|
| JP | 3163016  | 2/2001  |

* cited by examiner

Primary Examiner—Bot LeDynh
(74) Attorney, Agent, or Firm—Wenderoth, Lind & Ponack, L.L.P.

(57) ABSTRACT

An electromagnetic wave measuring apparatus includes a loop probe section having loop probes whose loop planes are placed so as to be perpendicular to each other, and each loop probe is placed so that its magnetic field detection space is not interfered with by other loop probes. If the loop probe section is placed at measurement position coordinates $x_i$, $y_j$, it detects a magnetic field component at the measurement position coordinates $x_i$, $y_j$, which is parallel to an XY plane, and a magnetic field component in a Z-axis direction at measurement position coordinates $x_i$, $y_{j-1}$, and repeats measurement by pitch p in a positive Y-axis direction. By calculating the root sum square of the detection results at each measurement position coordinate, a three-dimensional magnetic field level of an object to be measured can be obtained at each measurement position coordinate as electromagnetic field distribution with high-precision.

11 Claims, 21 Drawing Sheets

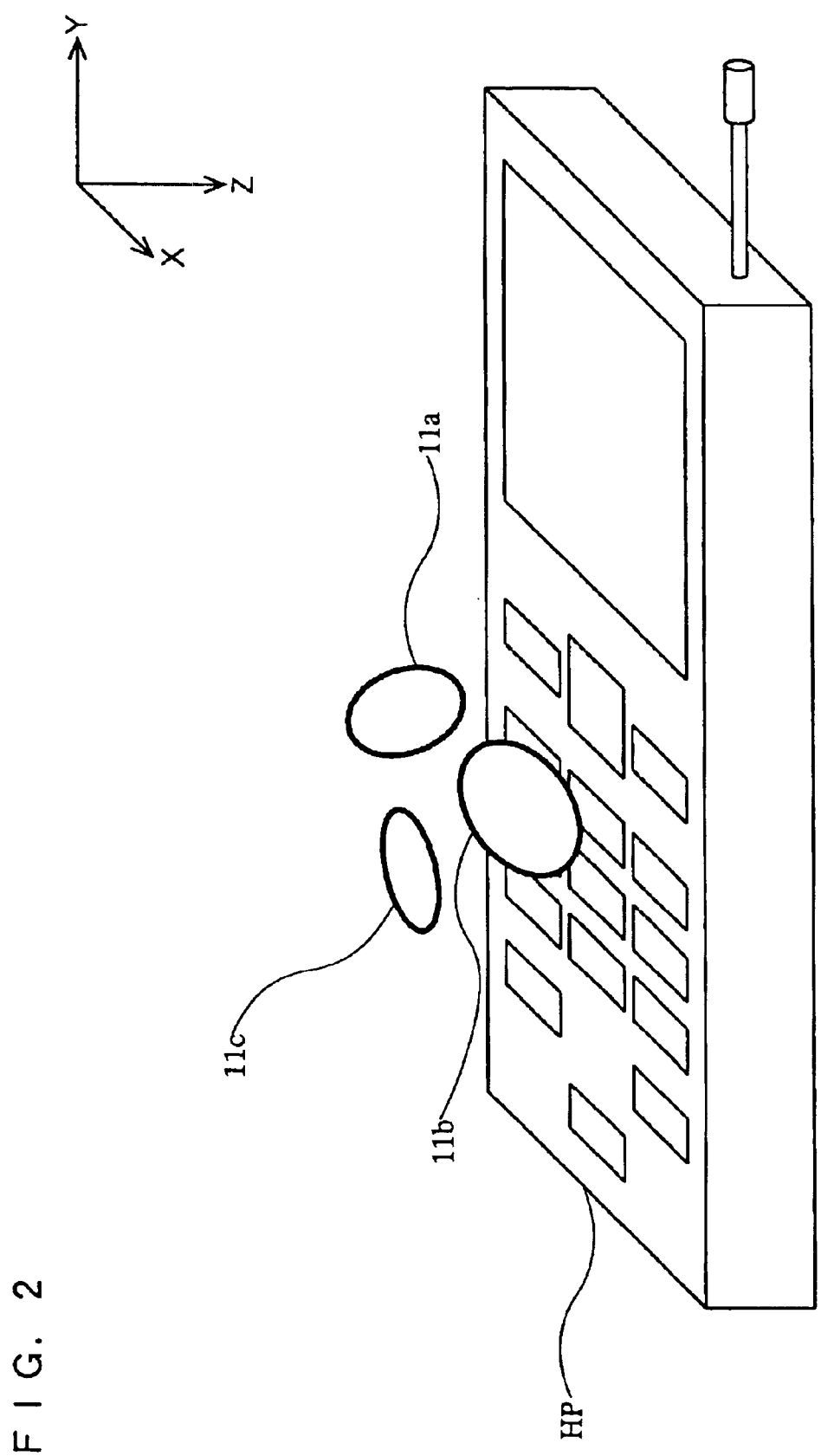

F I G. 3A
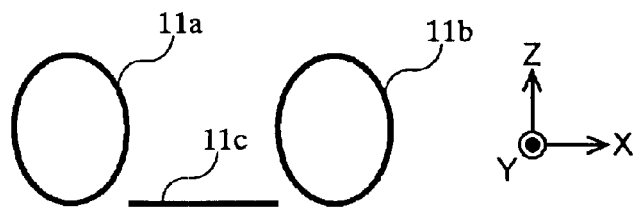
F I G. 3B
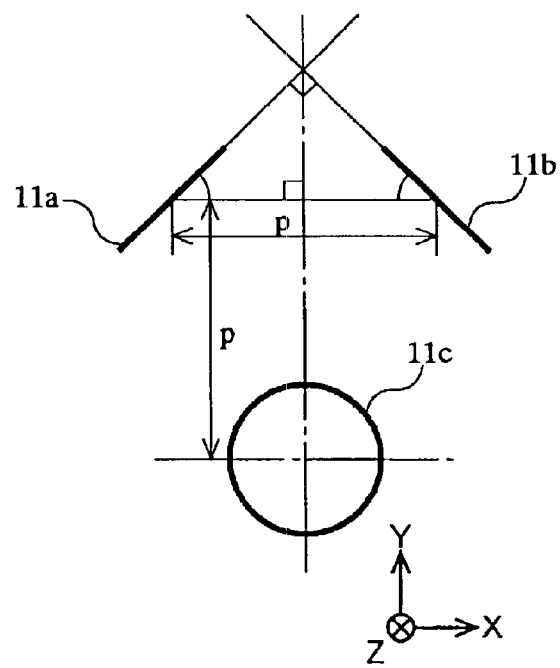
F I G. 3C
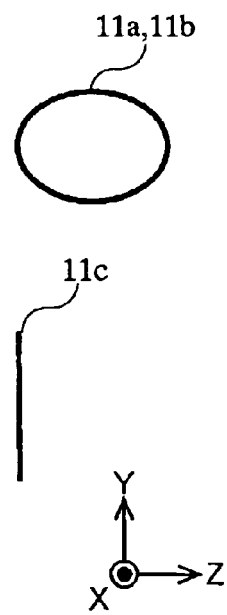

F I G. 6
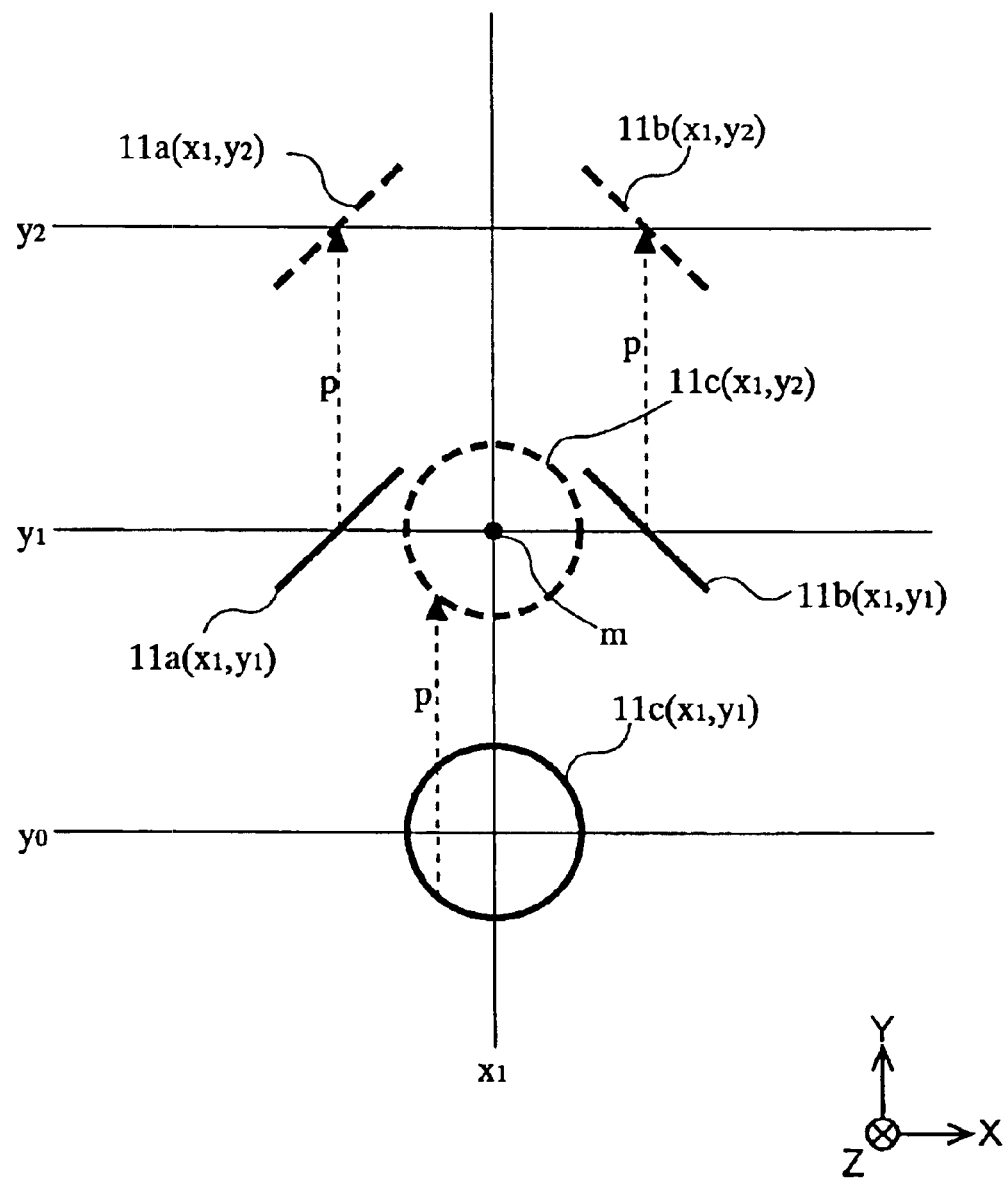

FIG. 7

| POSITION COORDINATES | LOOP PROBE | | | MAGNETIC FIELD LEVEL |
|---|---|---|---|---|
| | 11a | 11b | 11c | |
| (x1, y0) | — | — | — | — |
| (x1, y1) | Da(x1, y1) | Db(x1, y1) | Dc(x1, y1) | Dxyz(x1, y1) |
| (x1, y2) | Da(x1, y2) | Db(x1, y2) | Dc(x1, y2) | Dxyz(x1, y2) |
| (x1, y3) | Da(x1, y3) | Db(x1, y3) | Dc(x1, y3) | Dxyz(x1, y3) |
| (x1, y4) | Da(x1, y4) | Db(x1, y4) | Dc(x1, y4) | Dxyz(x1, y4) |
| (x1, y5) | Da(x1, y5) | Db(x1, y5) | Dc(x1, y5) | Dxyz(x1, y5) |
| (x1, y6) | Da(x1, y6) | Db(x1, y6) | Dc(x1, y6) | Dxyz(x1, y6) |
| (x1, y7) | Da(x1, y7) | Db(x1, y7) | Dc(x1, y7) | Dxyz(x1, y7) |
| ... | ... | ... | ... | ... |

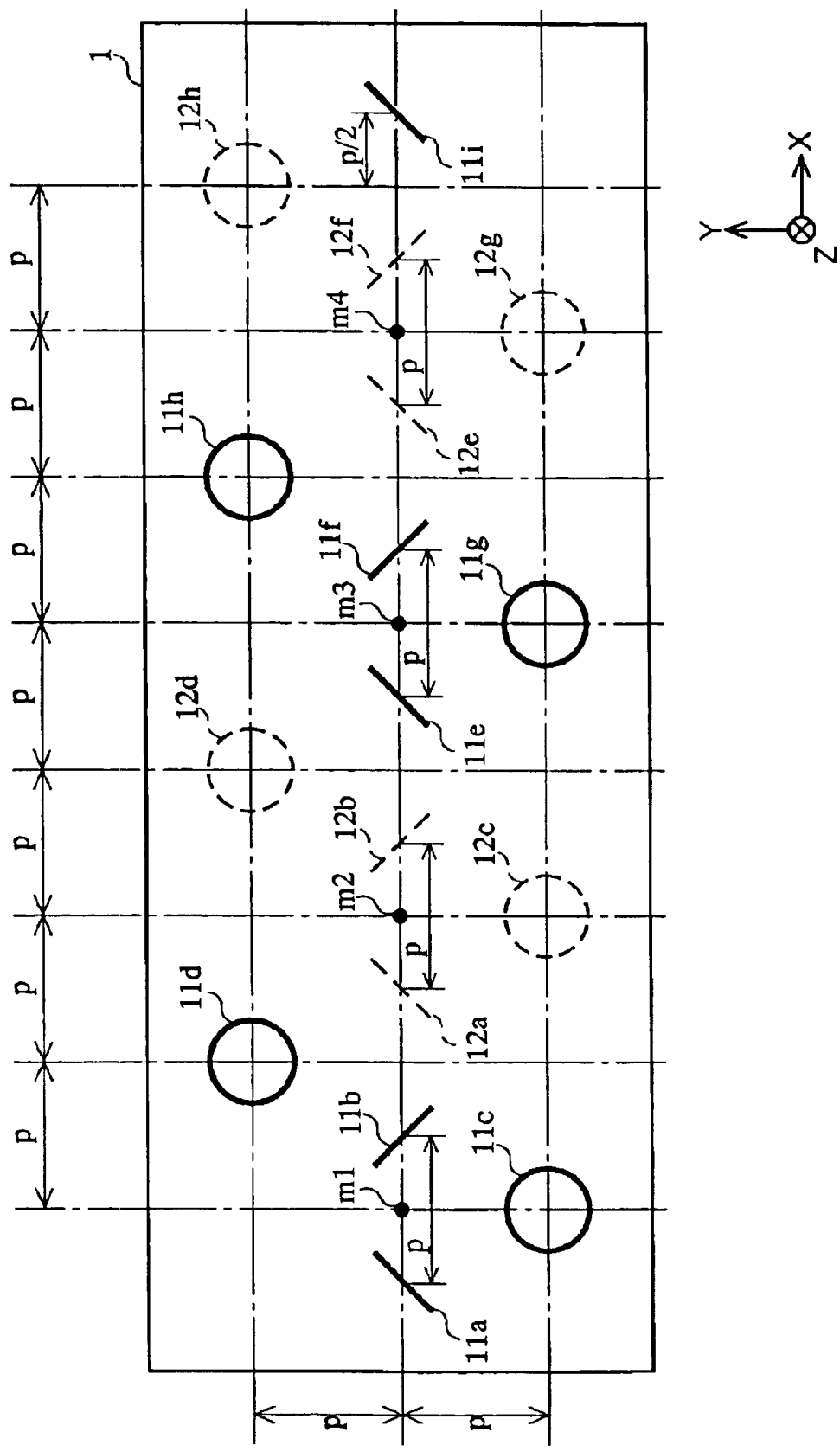
F I G. 8

FIG. 11

| POSITION COORDINATES | LOOP PROBE | | | MAGNETIC FIELD LEVEL |
|---|---|---|---|---|
| | 11a 11e 11i | 11b 11f | 11c 11d 11g 11h | |
| (x1,y1) | Da(x1,y1) | Db(x1,y1) | Dc(x1,y1) | Dxyz(x1,y1) |
| (x1,y2) | Da(x1,y2) | Db(x1,y2) | Dc(x1,y2) | Dxyz(x1,y2) |
| (x1,y3) | Da(x1,y3) | Db(x1,y3) | Dc(x1,y3) | Dxyz(x1,y3) |
| ⋮ | ⋮ | ⋮ | ⋮ | ⋮ |
| (x2,y1) | Da(x2,y1) | Db(x2,y1) | Dd(x2,y1) | Dxyz(x2,y1) |
| (x2,y2) | Da(x2,y2) | Db(x2,y2) | Dd(x2,y2) | Dxyz(x2,y2) |
| (x2,y3) | Da(x2,y3) | Db(x2,y3) | Dd(x2,y3) | Dxyz(x2,y3) |
| ⋮ | ⋮ | ⋮ | ⋮ | ⋮ |
| (x3,y1) | Da(x3,y1) | Db(x3,y1) | Dc(x3,y1) | Dxyz(x3,y1) |
| (x3,y2) | Da(x3,y2) | Db(x3,y2) | Dc(x3,y2) | Dxyz(x3,y2) |
| (x3,y3) | Da(x3,y3) | Db(x3,y3) | Dc(x3,y3) | Dxyz(x3,y3) |
| ⋮ | ⋮ | ⋮ | ⋮ | ⋮ |
| (x4,y1) | De(x4,y1) | Db(x4,y1) | Dd(x4,y1) | Dxyz(x4,y1) |
| (x4,y2) | De(x4,y2) | Db(x4,y2) | Dd(x4,y2) | Dxyz(x4,y2) |
| (x4,y3) | De(x4,y3) | Db(x4,y3) | Dd(x4,y3) | Dxyz(x4,y3) |
| ⋮ | ⋮ | ⋮ | ⋮ | ⋮ |
| (x5,y1) | De(x5,y1) | Df(x5,y1) | Dg(x5,y1) | Dxyz(x5,y1) |
| (x5,y2) | De(x5,y2) | Df(x5,y2) | Dg(x5,y2) | Dxyz(x5,y2) |
| (x5,y3) | De(x5,y3) | Df(x5,y3) | Dg(x5,y3) | Dxyz(x5,y3) |
| ⋮ | ⋮ | ⋮ | ⋮ | ⋮ |
| (x6,y1) | De(x6,y1) | Df(x6,y1) | Dh(x6,y1) | Dxyz(x6,y1) |
| (x6,y2) | De(x6,y2) | Df(x6,y2) | Dh(x6,y2) | Dxyz(x6,y2) |
| (x6,y3) | De(x6,y3) | Df(x6,y3) | Dh(x6,y3) | Dxyz(x6,y3) |
| ⋮ | ⋮ | ⋮ | ⋮ | ⋮ |
| (x7,y1) | De(x7,y1) | Df(x7,y1) | Dg(x7,y1) | Dxyz(x7,y1) |
| (x7,y2) | De(x7,y2) | Df(x7,y2) | Dg(x7,y2) | Dxyz(x7,y2) |
| (x7,y3) | De(x7,y3) | Df(x7,y3) | Dg(x7,y3) | Dxyz(x7,y3) |
| ⋮ | ⋮ | ⋮ | ⋮ | ⋮ |
| (x8,y1) | Di(x8,y1) | Df(x8,y1) | Dh(x8,y1) | Dxyz(x8,y1) |
| (x8,y2) | Di(x8,y2) | Df(x8,y2) | Dh(x8,y2) | Dxyz(x8,y2) |
| (x8,y3) | Di(x8,y3) | Df(x8,y3) | Dh(x8,y3) | Dxyz(x8,y3) |
| ⋮ | ⋮ | ⋮ | ⋮ | ⋮ |
| (xi,yi) | Dx(xi,yi) | Dy(xi,yi) | Dz(xi,yi) | Dxyz(xi,yi) |

FIG. 12

| LOOP PROBE | DETECTION LEVEL INFORMATION | |
|---|---|---|
| 11a $(x_i, y_j)$ | Da $(x_{i-1}, y_j)$ | Da $(x_i, y_j)$ |
| 11b $(x_i, y_j)$ | Db $(x_i, y_j)$ | Db $(x_{i+1}, y_j)$ |
| 11c $(x_i, y_j)$ | Dc $(x_i, y_{j-1})$ | |
| 11d $(x_i, y_j)$ | Dd $(x_{i+1}, y_{j+1})$ | |
| 11e $(x_i, y_j)$ | De $(x_{i+3}, y_j)$ | De $(x_{i+4}, y_j)$ |
| 11f $(x_i, y_j)$ | Df $(x_{i+4}, y_j)$ | Df $(x_{i+5}, y_j)$ |
| 11g $(x_i, y_j)$ | Dg $(x_{i+4}, y_{j-1})$ | |
| 11h $(x_i, y_j)$ | Dh $(x_{i+5}, y_{j+1})$ | |
| 11i $(x_i, y_j)$ | Di $(x_{i+7}, y_j)$ | Di $(x_{i+8}, y_j)$ |

F I G. 1 9
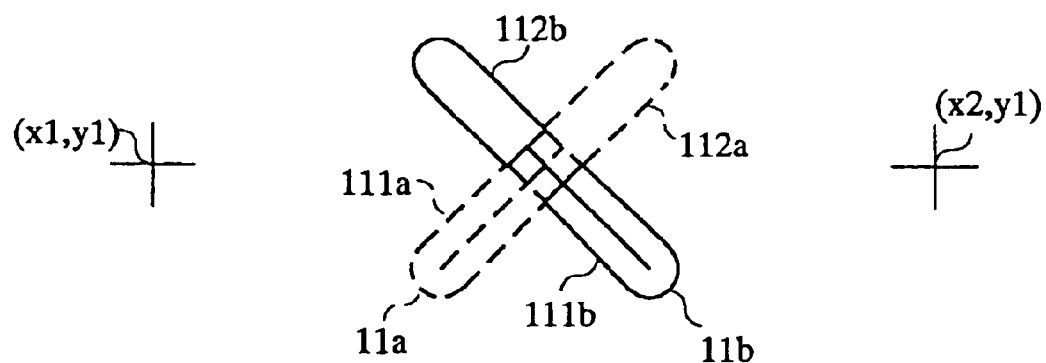

FIG. 20

| POSITION COORDINATES | LOOP PROBE | | | | | | MAGNETIC FIELD LEVEL |
|---|---|---|---|---|---|---|---|
| | FIRST RECIPROCATING MOVEMENT | | | SECOND RECIPROCATING MOVEMENT | | | |
| | 11a 11e 11i | 11b 11f | 11c 11d 11g 11h | 11a 11e 11i | 11b 11f | 11c 11d 11g 11h | |
| (x1, y1) | Da(x1, y1) | Db(x1, y1) | Dc(x1, y1) | Da(x1, y1) | — | — | Dxyz(x1, y1) |
| (x1, y2) | Da(x1, y2) | Db(x1, y2) | Dc(x1, y2) | Da(x1, y2) | — | — | Dxyz(x1, y2) |
| (x1, y3) | Da(x1, y3) | Db(x1, y3) | Dc(x1, y3) | Da(x1, y3) | — | — | Dxyz(x1, y3) |
| ⋮ | ⋮ | ⋮ | ⋮ | ⋮ | ⋮ | ⋮ | ⋮ |
| (x2, y1) | Da(x2, y1) | Db(x2, y1) | Dd(x2, y1) | Da(x2, y1) | Db(x2, y1) | Dc(x2, y1) | Dxyz(x2, y1) |
| (x2, y2) | Da(x2, y2) | Db(x2, y2) | Dd(x2, y2) | Da(x2, y2) | Db(x2, y2) | Dc(x2, y2) | Dxyz(x2, y2) |
| (x2, y3) | Da(x2, y3) | Db(x2, y3) | Dd(x2, y3) | Da(x2, y3) | Db(x2, y3) | Dc(x2, y3) | Dxyz(x2, y3) |
| ⋮ | ⋮ | ⋮ | ⋮ | ⋮ | ⋮ | ⋮ | ⋮ |
| (x3, y1) | Da(x3, y1) | Db(x3, y1) | Dc(x3, y1) | Da(x3, y1) | Db(x3, y1) | Dd(x3, y1) | Dxyz(x3, y1) |
| (x3, y2) | Da(x3, y2) | Db(x3, y2) | Dc(x3, y2) | Da(x3, y2) | Db(x3, y2) | Dd(x3, y2) | Dxyz(x3, y2) |
| (x3, y3) | Da(x3, y3) | Db(x3, y3) | Dc(x3, y3) | Da(x3, y3) | Db(x3, y3) | Dd(x3, y3) | Dxyz(x3, y3) |
| ⋮ | ⋮ | ⋮ | ⋮ | ⋮ | ⋮ | ⋮ | ⋮ |
| (x4, y1) | De(x4, y1) | Db(x4, y1) | Dd(x4, y1) | Da(x4, y1) | Db(x4, y1) | Dc(x4, y1) | Dxyz(x4, y1) |
| (x4, y2) | De(x4, y2) | Db(x4, y2) | Dd(x4, y2) | Da(x4, y2) | Db(x4, y2) | Dc(x4, y2) | Dxyz(x4, y2) |
| (x4, y3) | De(x4, y3) | Db(x4, y3) | Dd(x4, y3) | Da(x4, y3) | Db(x4, y3) | Dc(x4, y3) | Dxyz(x4, y3) |
| ⋮ | ⋮ | ⋮ | ⋮ | ⋮ | ⋮ | ⋮ | ⋮ |
| (x5, y1) | De(x5, y1) | Df(x5, y1) | Dg(x5, y1) | De(x5, y1) | Db(x5, y1) | Dd(x5, y1) | Dxyz(x5, y1) |
| (x5, y2) | De(x5, y2) | Df(x5, y2) | Dg(x5, y2) | De(x5, y2) | Db(x5, y2) | Dd(x5, y2) | Dxyz(x5, y2) |
| (x5, y3) | De(x5, y3) | Df(x5, y3) | Dg(x5, y3) | De(x5, y3) | Db(x5, y3) | Dd(x5, y3) | Dxyz(x5, y3) |
| ⋮ | ⋮ | ⋮ | ⋮ | ⋮ | ⋮ | ⋮ | ⋮ |
| (x6, y1) | De(x6, y1) | Df(x6, y1) | Dh(x6, y1) | De(x6, y1) | Df(x6, y1) | Dg(x6, y1) | Dxyz(x6, y1) |
| (x6, y2) | De(x6, y2) | Df(x6, y2) | Dh(x6, y2) | De(x6, y2) | Df(x6, y2) | Dg(x6, y2) | Dxyz(x6, y2) |
| (x6, y3) | De(x6, y3) | Df(x6, y3) | Dh(x6, y3) | De(x6, y3) | Df(x6, y3) | Dg(x6, y3) | Dxyz(x6, y3) |
| ⋮ | ⋮ | ⋮ | ⋮ | ⋮ | ⋮ | ⋮ | ⋮ |
| (x7, y1) | De(x7, y1) | Df(x7, y1) | Dg(x7, y1) | De(x7, y1) | Df(x7, y1) | Dh(x7, y1) | Dxyz(x7, y1) |
| (x7, y2) | De(x7, y2) | Df(x7, y2) | Dg(x7, y2) | De(x7, y2) | Df(x7, y2) | Dh(x7, y2) | Dxyz(x7, y2) |
| (x7, y3) | De(x7, y3) | Df(x7, y3) | Dg(x7, y3) | De(x7, y3) | Df(x7, y3) | Dh(x7, y3) | Dxyz(x7, y3) |
| ⋮ | ⋮ | ⋮ | ⋮ | ⋮ | ⋮ | ⋮ | ⋮ |
| (x8, y1) | Di(x8, y1) | Df(x8, y1) | Dh(x8, y1) | De(x8, y1) | Df(x8, y1) | Dg(x8, y1) | Dxyz(x8, y1) |
| (x8, y2) | Di(x8, y2) | Df(x8, y2) | Dh(x8, y2) | De(x8, y2) | Df(x8, y2) | Dg(x8, y2) | Dxyz(x8, y2) |
| (x8, y3) | Di(x8, y3) | Df(x8, y3) | Dh(x8, y3) | De(x8, y3) | Df(x8, y3) | Dg(x8, y3) | Dxyz(x8, y3) |
| ⋮ | ⋮ | ⋮ | ⋮ | ⋮ | ⋮ | ⋮ | ⋮ |
| (x9, y1) | Di(x9, y1) | — | — | Di(x9, y1) | Df(x9, y1) | Dh(x9, y1) | Dxyz(x9, y1) |
| (x9, y2) | Di(x9, y2) | — | — | Di(x9, y2) | Df(x9, y2) | Dh(x9, y2) | Dxyz(x9, y2) |
| (x9, y3) | Di(x9, y3) | — | — | Di(x9, y3) | Df(x9, y3) | Dh(x9, y3) | Dxyz(x9, y3) |
| ⋮ | ⋮ | ⋮ | ⋮ | ⋮ | ⋮ | ⋮ | ⋮ |
| (xi, yj) | Dx1(xi, yj) | Dy1(xi, yj) | Dz1(xi, yj) | Dy2(xi, yj) | Dx2(xi, yj) | Dz2(xi, yj) | Dxyz(xi, yj) |

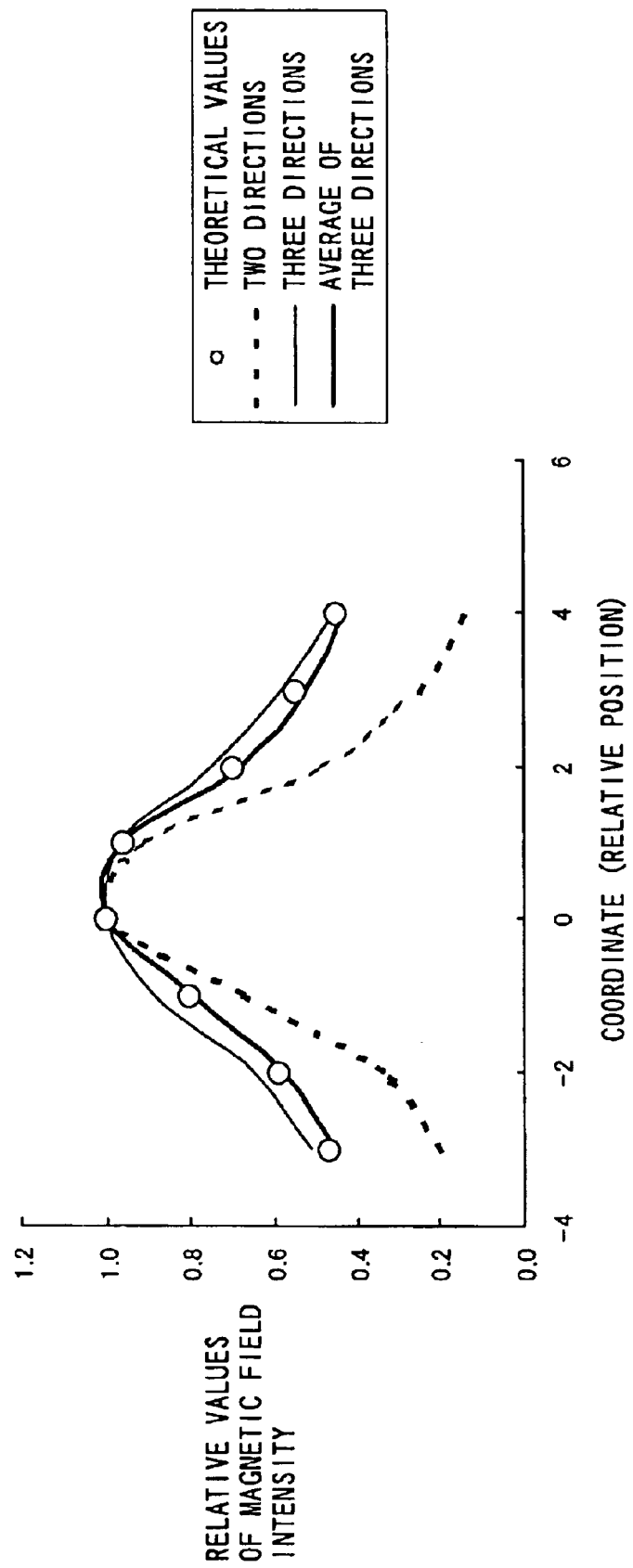

ELECTROMAGNETIC WAVE MEASURING APPARATUS AND METHOD

BACKGROUND OF THE INVENTION

1. Field of the Invention

The present invention relates to electromagnetic wave measuring apparatuses and methods for measuring electromagnetic waves radiated from electronic components. More particularly, the present invention relates to an electromagnetic wave measuring apparatus and method for measuring an electromagnetic field distribution of electromagnetic waves radiated from portable wireless devices such as mobile phones.

2. Description of the Background Art

In recent years, the use of portable wireless devices such as mobile phone has become rapidly widespread on a global scale. At the same time, electromagnetic waves are controlled due to concerns about possible health effects which could result from exposure to an electromagnetic field radiated from a portable wireless device used in close proximity to a human body.

There already exists a technique known as a parallel detection method, which is adopted in an apparatus for measuring a distribution of an electromagnetic field radiated from an electronic device such as a portable wireless device. For example, Japanese Patent Laid-Open Publication No. H9-304456 discloses an apparatus utilizing the parallel detection method. This apparatus has a plurality of micro loop components arranged in lines with respect to an object to be measured, and a plurality of level detection sections corresponding to the micro loop components, thereby concurrently storing and processing signals detected by the micro loop components. With this conventional apparatus, it is possible to measure a two-dimensional distribution of an electromagnetic field of electromagnetic waves radiated from the object to be measured by moving the plurality of micro loop components in a predetermined direction.

Also, an apparatus utilizing the parallel detection method, which is disclosed in Japanese Patent Gazette No. 3163016, adopts a tabular layout of a plurality of loop components arranged like non-parallel sides of a trapezoid with respect to an object (e. g., an electronic circuit substrate) to be measured. With this conventional apparatus, it is possible to measure a two-dimensional distribution of an electromagnetic field of electromagnetic waves radiated from the object to be measured by moving the plurality of loop components.

There also exists a technique known as a sequential selection method, which is adopted in an apparatus for measuring an electromagnetic field distribution radiated from the electronic devices. The apparatus utilizing the sequential selection method, for example, adopts a two-dimensional grid-like layout of a large number of micro loop components, and sequentially selects the micro loop components by a switching diode, etc., thereby processing signals detected by the micro loop components.

In general, the main object of these conventional apparatuses for measuring an electromagnetic field distribution is to measure a two-dimensional electromagnetic field of a low frequency under approximately 1 GHz, which is radiated from an object to be measured such as an electronic circuit substrate.

For example, if the object to be measured includes a three-dimensional electromagnetic wave source of high frequency (e.g., 2 GHz) such as a mobile phone, electromagnetic waves radiated therefrom and an electromagnetic field distribution are also three-dimensional. However, the above conventional apparatuses for measuring an electromagnetic field distribution, in which a plurality of micro loop components are arranged in a two-dimensional manner, are unable to detect a three-dimensional electromagnetic field distribution, which results in poor measurement accuracy.

Also, in the case of the apparatus utilizing the sequential selection method, the micro loop components having a two-dimensional grid-like layout are sequentially selected and processed, whereby enormous amounts of scanning time are required. Furthermore, due to the influence of capacitance between terminals of a switching diode and frequency characteristics of a transmission line, there arises a problem of degradation of sensitivity characteristics and isolation between the adjacent micro loop components at an extra high frequency (for example, 2 GHz).

In the case of the apparatus utilizing the parallel detection method, a scanning time can be reduced by parallel processing of signals detected by a plurality of micro loop components. However, each micro loop component has to be provided with a detection section, which results in an increased cost.

SUMMARY OF THE INVENTION

Therefore, an object of the present invention is to provide an electromagnetic wave measuring apparatus and method which realize high-precision measurement of an electromagnetic field distribution of three-dimensional electromagnetic waves radiated from a portable wireless device such as a mobile phone.

The present invention has the following features to attain the object mentioned above.

An electromagnetic wave measuring apparatus of the present invention comprises an electromagnetic probe section, a stage section, a driving section, an electromagnetic wave level generating section, and a calculation processing section. The electromagnetic pro section at least integrally includes a first loop probe, a second loop probe, and a third loop probe. The first loop probe forms a first loop plane. The second loop probe forms a second loop plane perpendicular to the first loop plane. The third loop probe forms a third loop plane perpendicular to the first and second loop planes. The stage section, on which an object to be measured is mounted, places the object under the electromagnetic probe section. The driving section causes a movement of one of the electromagnetic probe section and the stage section relative to the other. The electromagnetic wave level generating section at least includes first to third generating sections. The first to third generating sections detect induced electric signals from the respective first to third loop probes, and generate first to third electromagnetic field level information indicating intensities of electromagnetic waves perpendicular to the respective first to third loop planes. The calculating section calculates three-dimensional electromagnetic field level information indicating intensities of three-dimensional electromagnetic waves based on the respective electromagnetic field level information generated by the electromagnetic wave level generating section.

Based on the structure of the present invention, it is possible to detect a three-dimensional electromagnetic field distribution by loop planes in three directions, which are perpendicular to each other. Thus, it is possible to calculate with high-precision the electromagnetic field distribution of an object to be measured by calculating a three-dimensional electromagnetic field level.

The first and second loop probes may be placed so that loop centers of the first and second loop probes are away from each other by a predetermined pitch with respect to a first direction parallel to a stage plane of the stage section on which the object is mounted, and the first and second loop planes are formed so as to be at a 45-degree angle with a segment connecting the loop centers and be perpendicular to the object. Also, the third loop probe, which is parallel to the object, may be placed outside the magnetic field detection spaces of the first and second loop probes, and a loop center thereof may be away from a midpoint of the segment connecting the loop centers of the first and second loop probes by the predetermined pitch in a second direction, which is perpendicular to the first direction and is parallel to the object. As a result, a plurality of loop probes, whose loop planes are perpendicular to each other, are placed so that each of the loop probes is not interfered with by other loop probes, whereby it is possible to minimize the occurrence of coupling between the adjacent loop probes. Also, the driving section moves the electromagnetic probe section in accordance with a predetermined pitch, which coincides with a distance between the loop centers of the first and second loop probes and a distance between a midpoint of the segment connecting the loop centers of the first and second loop probes and a loop center of the third loop probe, whereby it is possible to measure an electromagnetic field distribution efficiently.

Also, the electromagnetic probe section may integrally include fourth to eighth loop probes. The fourth loop probe forms a fourth loop plane parallel to the third loop plane, and its loop center is placed in a position away from the midpoint by the predetermined pitch in the second direction so as to be opposite to a position of the third loop probe with respect to the midpoint, and away therefrom by the predetermined pitch in the first direction. The fifth to eighth loop probes, which form fifth to eighth loop planes, respectively, parallel to the corresponding first to fourth loop plane, are included in another set of loop probes corresponding to a set of the first to fourth loop probes, and are placed in positions away from the respective first to fourth loop probes at a fourfold distance of the predetermined pitch in the first direction. In this case, the electromagnetic wave level generating section further includes fourth to eighth generating sections for detecting induced electric signals detected by the fourth to eighth loop probes, and generating fourth to eighth electromagnetic field level information indicating intensities of electromagnetic waves perpendicular to the respective fourth to eighth loop planes. Thus, an electromagnetic wave measuring area of the object is extended in the first direction, whereby it is possible to select suitable electromagnetic field level information in accordance with the position coordinates indicating a distribution of electromagnetic waves. Also, it is possible to ensure isolation between the first to fourth loop probes and the fifth to eighth loop probes by keeping enough distance therebetween.

Furthermore, the electromagnetic probe section may integrally include a ninth loop probe. The ninth loop probe forms a ninth loop plane parallel to the fifth loop plane, and its loop center is placed in a position away from a loop center of the fifth loop probe at a fourfold distance of the predetermined pitch in the first direction with respect to the sixth loop probe. In this case, the electromagnetic wave level generating section further includes a ninth generating section for detecting an induced electric signal detected by the ninth loop probe, and generating ninth electromagnetic field level information indicating intensities of electromagnetic waves perpendicular to the ninth loop plane. Thus, it is possible to calculate an electromagnetic field distribution with respect to eight measurement position coordinates, which are provided in one direction, by one reciprocating movement. Also, a three-dimensional electromagnetic field distribution over a wide range of areas can be measured by nine loop probes, whereby the structure of the apparatus can be simplified. As a result, it is possible to realize substantial cost reduction.

Still further, the electromagnetic probe section may further integrally include first and second groups of dummy loop probes. The first and second groups of dummy loop probes are unconnected to each other, and are placed in positions away from the first to fourth loop probes at twofold and sixfold distances, respectively, of the predetermined pitch in the first direction, each group of which have identical positional relationship and structure of the first to fourth loop probes. Thus, it is possible to enhance symmetry of reception characteristics of the loop probe, which is caused by electromagnetic field coupling.

For example, each of the first to ninth loop probes has a semicircle of a loop circle as a feeding point. In this case, the first, second, fifth, sixth, and ninth loop probes are placed so that feeding points thereof face a same side with respect to the second direction. The third and seventh loop probes are placed so that the feeding points thereof are oriented in one direction, and the fourth and eighth loop probes are placed so that the feeding points thereof are oriented in a direction opposite to the direction in which the feeding points of the third and seventh loop probes are oriented. Thus, it is possible to measure a high-precision magnetic field distribution with limited influence from the electric fields by averaging data, which is obtained by the loop probe having a shielded structure, by two reciprocating movements. Also, this measurement requires only a short movement in the first direction, whereby it is possible to realize size reduction of the driving system device. For example, the feeding point is formed in each of the first to ninth loop probes by bending a portion of a coaxial tube, which is connected to the electromagnetic wave level generating section, into a semicircle of the loop circle, other semicircle of the loop circle is composed of copper wire, and one end of the coaxial tube and one end of the copper wire are essentially connected by a core wire of the coaxial tube.

Note that, as is the case with the above-described electromagnetic wave measuring apparatus, the present invention can be realized as an electromagnetic wave measuring method. In the electromagnetic wave measuring method, the three-dimensional electromagnetic field level information may be calculated using the root sum square of the first to third electromagnetic field level information in a calculating step of calculating the three-dimensional electromagnetic field level information. Thus, it is possible to calculate a three-dimensional electromagnetic field level appropriately and easily, using the induced electric signals detected by the loop planes in three directions, which are perpendicular to each other.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view for describing the placement of three loop probes which are set for measuring an electromagnetic field distribution of an object HP to be measured shown in FIG. 1;

FIG. 3A is a schematic illustration showing a direction opposite to a Y-axis direction using the third angle projection method for describing an exemplary loop probe placement in an electromagnetic probe section 1 of FIG. 1;

FIG. 3B is a schematic illustration showing a Z-axis direction using the third angle projection method for describing an exemplary loop probe placement in the electromagnetic probe section 1 of FIG. 1;

FIG. 3C is a schematic illustration showing a direction opposite to an X-axis direction using the third angle projection method for describing an exemplary loop probe placement in the electromagnetic probe section 1 of FIG. 1;

FIG. 6 is a schematic illustration for describing the placement of loop probes 11a to 11c when the calculation processing section 3 according to the first embodiment of the present invention moves the object HP;

FIG. 7 is an illustration for describing an exemplary data table stored in a storing section 32 according to the first embodiment of the present invention;

FIG. 8 is a schematic illustration for describing an exemplary loop probe placement in the electromagnetic probe section according to a second embodiment of the present invention;

FIG. 11 is an illustration for describing an exemplary data table stored in the storing section 32 according to the second embodiment of the present invention;

FIG. 12 is an illustration for describing a reference used when detection level information is written into the data table;

FIG. 19 is a schematic illustration for describing a positional relationship of the loop probes 11a and 11b in the averaging process of FIG. 17;

FIG. 20 is an illustration for describing an exemplary data table stored in the storing section 32 according to the third embodiment of the present invention; and FIG. 21 is a graph showing electromagnetic field distribution characteristics obtained by the electromagnetic wave measuring apparatus of the present invention.

DESCRIPTION OF THE PREFERRED EMBODIMENTS (First Embodiment)

Figure 1:
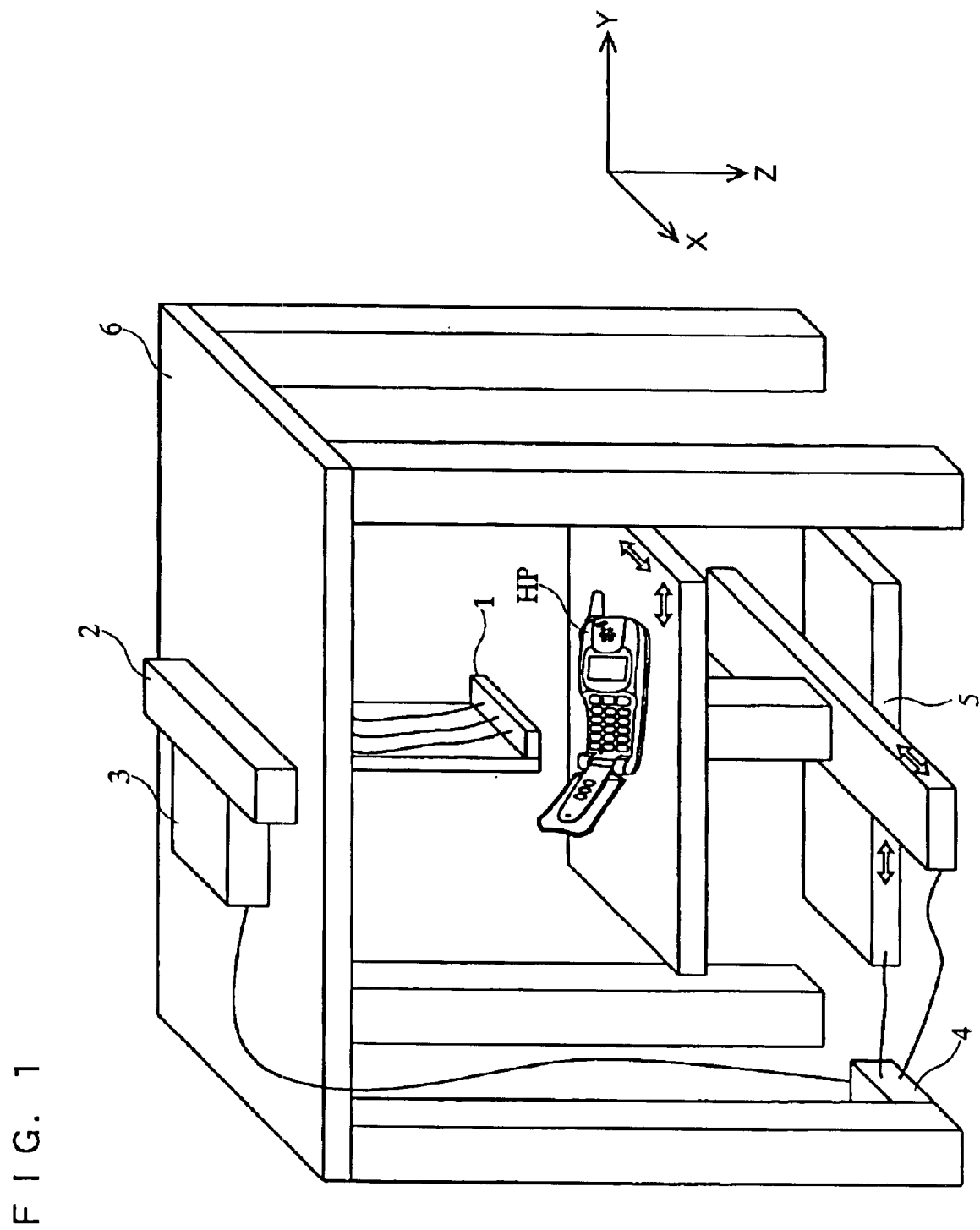
FIG. 1 is a perspective view showing a schematic structure of an electromagnetic wave measuring apparatus according to first to third embodiments of the present invention.

With reference to FIG. 1, an electromagnetic wave measuring apparatus according to a first embodiment will be described. FIG. 1 is a perspective view showing a schematic structure of the electromagnetic wave measuring apparatus. The electromagnetic wave measuring apparatus measures an electromagnetic field distribution of electromagnetic waves radiated from an object to be measured. In the following descriptions, it is assumed that the object HP to be measured (hereinafter, referred to as an object HP) is a portable wireless device such as a mobile phone.

In FIG. 1, the electromagnetic wave measuring apparatus includes an electromagnetic probe section 1, an electromagnetic field level detection section 2, a calculation processing section 3, a table driving section 4, an XY table 5, and a supporting section 6. The object HP, for which measurement is performed by the electromagnetic wave measuring apparatus, is mounted on a table top of the XY table 5. In the following descriptions, it is assumed that the table top of the table 5, on which the object HP is mounted, is an XY plane, a minor axis of the object HP corresponds to an X-axis direction shown in FIG. 1 (hereinafter, a direction toward the front is described as a positive X-axis direction), and a major axis of the object HP corresponds to a Y-axis direction shown in FIG. 1 (hereinafter, a direction to the right is described as a positive Y-axis direction). Also, as shown in FIG. 1, it is assumed that a direction perpendicular to the XY plane is a Z-axis direction, and a direction from the upper portion of FIG. 1 toward the object HP is described as a positive Z-axis direction. The XY table 5 can move its table top in the X- and Y-axis directions according to an instruction from the table driving section 4. That is, in accordance with the instruction from the table driving section 4, it is possible to move the object HP, which is mounted on the table top, in the X-axis direction (a first measurement direction) and in the Y-axis direction (a second measurement direction).

The electromagnetic probe section 1 having a plurality of magnetic field detection probes, which will be described further below, is secured to the supporting section 6 by a predetermined securing member, and is placed above the table top of the XY table 5. The plurality of magnetic field detection probes of the electromagnetic probe section 1 are connected to the electromagnetic field level detection section 2, which is secured to the supporting section 6, via respective predetermined transmission lines.

The electromagnetic field level detection section 2 composed of a plurality of circuits, which will be described further below, generates detection level information corresponding to an intensity of an electromagnetic field from induced electric signals detected by the plurality of magnetic field detection probes, and outputs the generated detection level information to the calculation processing section 3 secured to the supporting section 6.

The calculation processing section 3, which is a typical computer system, includes a CPU (central processing section n) and a storing section for storing calculating results of the CPU. The calculation processing section 3 performs calculation for a detection level signal output from the electromagnetic field level detection section 2 in accordance with a predetermined method, which will be described further below. Also, the calculation processing section 3, which is connected to the table driving section 4 via a predetermined transmission line, outputs a driving instruction to the table driving section 4 composed of an NC driver, etc., in order to move the object HP in the X- and Y-axis directions with respect to the electromagnetic probe section 1. In response to the driving direction from the calculation processing section 3, the table driving section 4 moves the table top of the XY table 5 in the X- and Y-axis directions. In order to measure an electromagnetic field of electromagnetic waves radiated from the object HP, the object HP is placed close to the electromagnetic probe section 1 with respect to the Z-axis direction. For this purpose, a distance between the table top of the XY table 5 and the electromagnetic probe section 1 may be previously adjusted in the Z-axis direction, or may be appropriately adjusted in accordance with an instruction from the calculation processing section 3 or the table driving section 4 by enabling the table top of the XY table 5 to move also in the Z-axis direction.

With reference to FIGS. 2 and 3, positions of probes in the case where the electromagnetic probe section 1 has three loop probes as the plurality of magnetic field detection probes will be described. FIG. 2 is a perspective view for describing the placement of the three loop probes which are set for measuring an electromagnetic field distribution of the object HP. FIGS. 3A to 3C are schematic illustrations showing the three loop probes seen from respective three directions using third angle projection method for describing an exemplary loop probe placement in the electromagnetic probe section 1 (that is, the object HP lies above FIG. 3A). FIG. 3B is a schematic illustration of a loop probe placement in the case where the loop probes are seen from the positive Z-axis direction shown in FIG. 1. As described above, each loop probe is connected to the electromagnetic field level detection section 2 by a transmission line, and is secured to the supporting section 6 by the securing member. In the following descriptions, however, the transmission line and the securing member are omitted in FIGS. 2 and 3 for the sake of simplicity.

FIG. 2 and FIGS. 3A to 3C show three loop probes 11a to 11c (which are the plurality of magnetic field detection probes of the electromagnetic probe section 1). Based on Faraday's law, in theory, the loop probes 11a to 11c can detect a magnetic field with their loop-shaped conducting wires. The loop probes 11a to 11c show the maximum reception sensitivity to a magnetic field perpendicular to a plane inside of a loop circle (hereinafter, referred to as a loop plane), and the reception sensitivity of the loop probes 11a to 11c becomes zero with respect to a magnetic field parallel to the loop plane. Each of the loop probes 11a to 11c is connected between a core wire of the transmission line, which is used for connection with the electric field level detection section 2 and is composed of a coaxial wire, and a ground. Hereinafter, the loop probes 11a to 11c are referred to as loop probes 11 in the case where the loop probes 11a to 11c are described collectively.

In FIGS. 2 and 3B, the loop planes of the loop probes 11a and 11b are placed parallel to a Z-axis shown in the drawings. The loop planes of the loop probes 11a and 11b form an angle of 90 degrees, and each forms an angle of 45 degrees with an X-axis shown in the drawings. A distance between loop centers of the loop probes 11a and 11b is a predetermined pitch p (for example, 5 mm), and the loop probes 11a and 11b are placed so that their magnetic field detection spaces (see FIG. 3A) are not interfered with by other loop probes. That is, seen from the positive Z-axis direction, the loop probes 11a and 11b forms a shape like non-parallel sides of a trapezoid.

The loop plane of the loop probe 11c is placed so as to be parallel to the XY plane. That is, the loop plane of the loop probe 11c is placed so as to be perpendicular to the loop planes of the loop probes 11a and 11b. A loop center of the loop probe 11c is placed on a perpendicular line passing through a midpoint of a segment connecting the loop centers of the loop probes 11a and 11b, and a distance between the loop center of the loop probe 11c and the segment connecting the loop centers of the loop probes 11a and 11b is pitch p. The loop probe 11c is placed so that its magnetic field detection space is not interfered with by other loop probes 11a and 11b (see FIG. 3C).

As such, the loop planes of the loop probes 11a to 11c are placed so as to be perpendicular to each other, whereby it is possible to detect a three-dimensional magnetic field. Specifically, magnetic field components parallel to the XY plane are detected by the loop probes 11a and 11b, and magnetic field components in the Z-axis direction are detected by the loop probe 11c. Furthermore, the loop planes of the loop probes 11a and 11b form an angle of 90 degrees, the loop plane of the loop probe 11c is formed so as to be perpendicular to the loop planes of the loop probes 11a and 11b, and each loop probe is placed so that its magnetic field detection space is not interfered with by other loop probes. As a result, it is possible to minimize the occurrence of coupling between the adjacent loop probes 11a to 11c. Note that it is possible to place a plurality of sets of the above-described loop probes 11a to 11c. In this case, an electromagnetic field distribution, which will be described below, can be measured over a wide range of areas.

Figure 4:
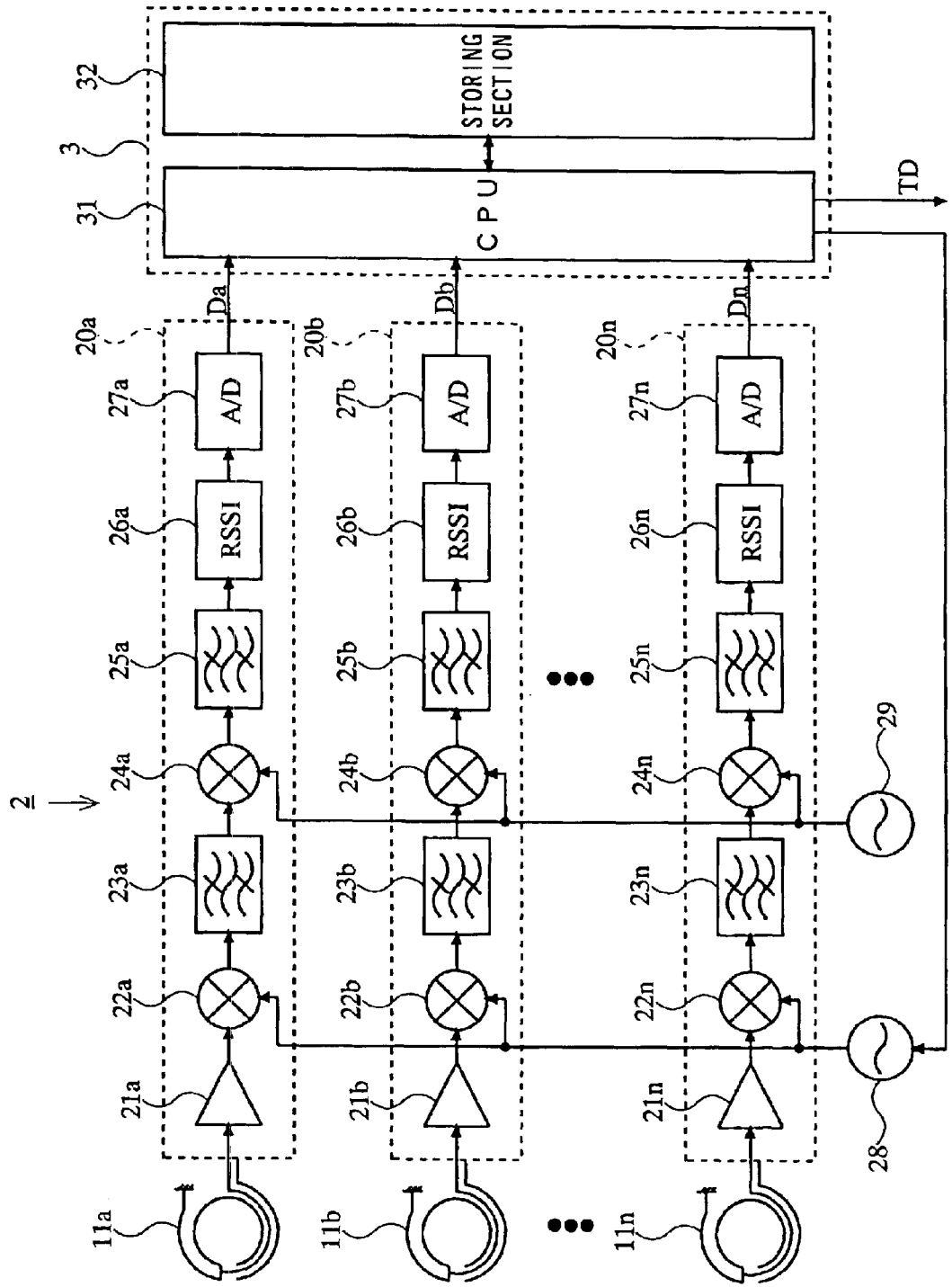
FIG. 4 is a block diagram showing the structures of an electromagnetic field level detection section 2 and a calculation processing section 3 of FIG. 1.

With reference to FIG. 4, the structures of the electromagnetic field level detection section 2 and the calculation processing section 3 will be described. FIG. 4 is a block diagram showing the structures of the electromagnetic field level detection section 2 and the calculation processing section 3.

In FIG. 4, the calculation processing section 3 has a CPU 31 and a storing section 32. In accordance with the procedure described below, the CPU 31 outputs, to the table driving section 4, table driving data TD used for moving the table top of the XY table 5.

In order to process the induced electric signals whose electromagnetic fields are detected by the loop probes 11a to 11c, signal detection unit lines 20a to 20n are set in the electromagnetic field level detection section 2. The signal detection unit line 20a is composed of a signal amplifying unit 21a, a first frequency converter 22a, a first frequency band limiting unit 23a, a second frequency converter 24a, a second frequency band limiting unit 25a, a signal level detecting unit 26a, and an A/D converter 27a, which are connected in series. Other signal detection unit lines 20b to 20n include the same units as the signal detection unit line 20a. Other than the signal detection unit lines 20a to 20n, the electromagnetic field level detection section 2 has first and second local oscillating units 28 and 29.

Detection level information Da to Dn output from the A/D converters 27a to 27n of the respective signal detection unit lines 20a to 20n is input to the CPU 31 of the calculation processing section 3, and stored in the storing section 32. A local oscillation signal from the first local oscillating unit 28 is divided and input to the first frequency converters 22a to 22n of the respective signal detection unit lines 20a to 20n. An oscillating frequency of the first local oscillating unit 28 is controlled by a frequency control signal output from the CPU 31. A local oscillation signal from the second local oscillating unit 29 is divided and input to the second frequency converters 24a to 24n of the respective signal detection unit lines 20a to 20n.

The loop probes 11a to 11n detect electromagnetic radiation from the object HP, convert the detected electromagnetic radiation into induced electric signals, and output the signals to the respective signal amplifying units 21a to 21n. The loop probes 11a to 11n detect signal frequencies over a wide range of frequencies of 800 MHz to 2000 MHz, which correspond to communication frequencies of mobile phones. The signal amplifying units 21a to 21n are low noise amplifiers having flat frequency characteristics over the above wide range of frequencies. The signal amplifying units 21a to 21n amplify the input signal by about 10 to 20 dB, and output the signal to the respective first frequency converters 22a to 22n.

The first frequency converters 22a to 22n are double balanced mixers composed of diodes and transistors. The first frequency converters 22a to 22n convert a frequency of the signal within a range of 800 MHz to 2000 MHz, which is output from the respective signal amplifying units 21a to 21n, into a frequency corresponding to a difference between the frequency of the above signal and the frequency of the local oscillation signal from the first local oscillating unit 28, and output the frequency to the respective first frequency band limiting units 23a to 23n. Here, an oscillating frequency of the first local oscillating unit 28, which functions as a voltage control variable frequency oscillating unit, is controlled by the frequency control signal from the CPU 31 within a range of 1200 MHz to 2400 MHz. That is, a signal within a range of 800 MHz to 2000 MHz input to the first frequency converters 22a to 22n from the respective signal amplifying units 21a to 21n is converted into a first intermediate frequency of 400 MHz. Note that a frequency component (a frequency component within a range of 2000 MHz to 4400 MHz) corresponding to the sum of the frequency of the signal within a range of 800 MHz to 2000 MHz and the frequency of the local oscillation signal from the first local oscillating unit 28 is not detected. Specifically, the above frequency component within a range of 2000 MHz to 4400 MHz is not output because it is attenuated by the detection frequency characteristics of the loop probes 11a to 11n.

The first frequency band limiting units 23a to 23n are band-pass filters such as surface acoustic wave filters (SAW filters) and dielectric filters, whose central frequency is the first intermediate frequency (400 MHz), and their pass-band width is set to a narrow band of a few kHz to a few MHz. The first frequency band limiting units 23a to 23n band-limit the signal whose frequency is converted by the respective first frequency converters 22a to 22n, and output the signal to the respective second frequency converters 24a to 24n.

The second frequency converters 24a to 24n convert a frequency of the signal, which is band-limited by the first frequency band limiting units 23a to 23n, into a frequency corresponding to a difference (frequency difference component) between the frequency of the above signal and the frequency of the local oscillation signal from the second local oscillating unit 29, and output the frequency to the respective second frequency band limiting units 25a to 25n. Here, an oscillation frequency of the second local oscillating unit 29 is fixed to 410.7 MHz. Thus, a signal having the frequency difference component (that is, a second intermediate frequency of 10.7 MHz) is output to the second frequency band limiting units 25a to 25n.

The second frequency band limiting units 25a to 25n are band-pass filters such as ceramic filters, and their pass-band width is set up to few hundreds of KHz. This pass-band width is a frequency resolution bandwidth of the electromagnetic wave measuring apparatus. The second frequency band limiting units 25a to 25n band-limit the signal whose frequency is converted by the respective second frequency converters 24a to 24n, and output the signal to the signal level detecting units 26a to 26n.

The signal level detecting units 26a to 26n perform signal level detection in the second intermediate frequency which is band-limited by the respective second frequency band limiting units 25a to 25n. The signal level detecting units 26a to 26n are multi-stage logarithm amplifiers, and detection therefrom is output as a linear signal with respect to a decibel level of an input signal level using a RSSI (Received Signal Strength Indicator). The RSSI output from the signal level detecting units 26a to 26n is output to the respective A/D converters 27a to 27n. The A/D converters 27a to 27n convert the RSSI signal from analog to digital, and output detection level information Da to Dn to the CPU 31.

Figure 5:
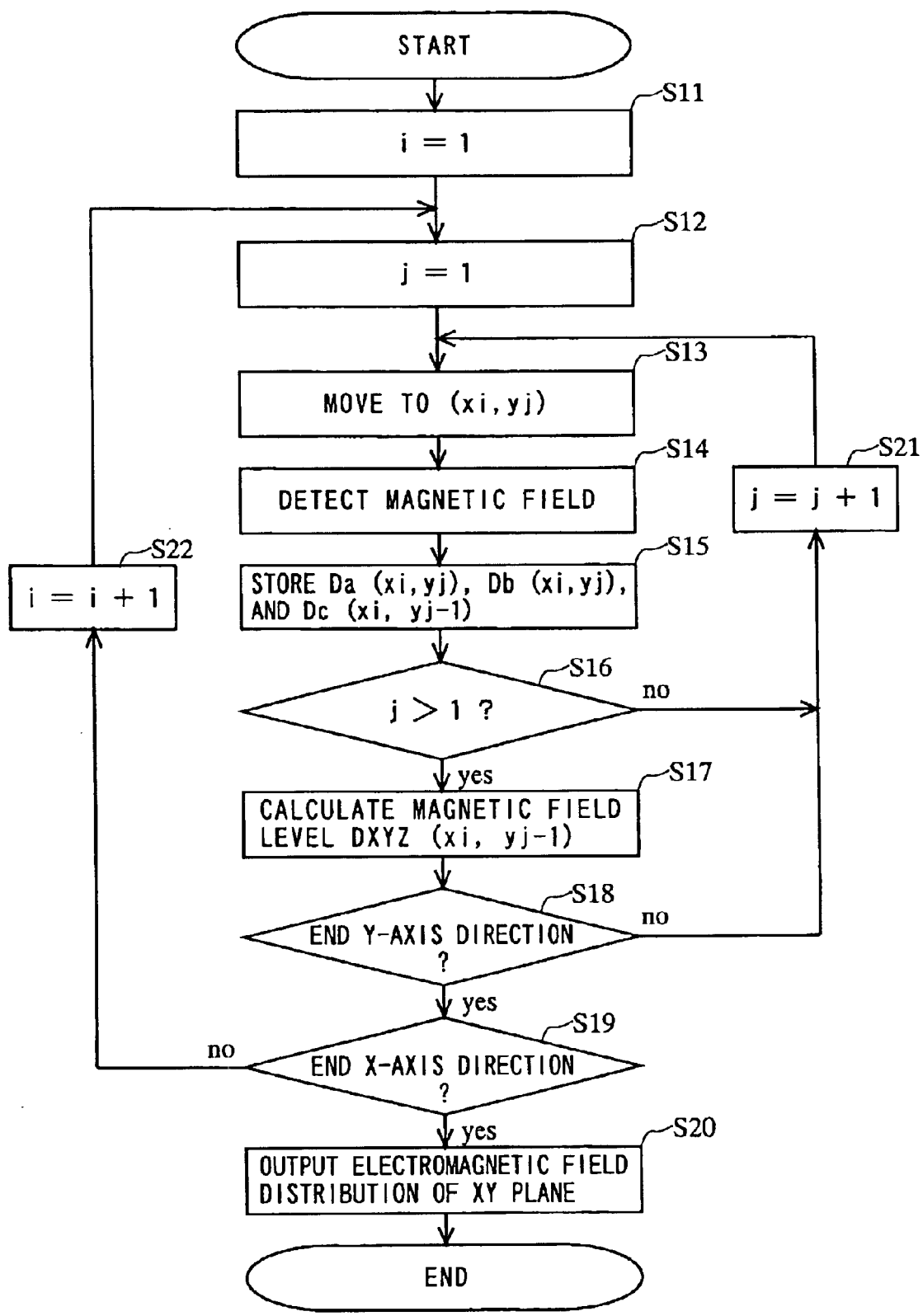
FIG. 5 is a flowchart showing an electromagnetic field distribution calculation process performed by the calculation processing section 3 according to a first embodiment of the present invention.

Next, with reference to FIGS. 5 to 7, an electromagnetic field distribution calculation process performed by the calculation processing section 3 will be described. FIG. 5 is a flowchart showing the electromagnetic field distribution calculation process performed by the calculation processing section 3. FIG. 6 is a schematic illustration for describing positions of the loop probes 11a to 11c when the calculation processing section 3 moves the object HP, and FIG. 7 is an illustration for describing an exemplary data table stored in the storing section 32. In the following descriptions, it is assumed that the plurality of magnetic field detection probes of the electromagnetic probe section 1 are the above-described three loop probes 11a to 11c.

When an electromagnetic field distribution of the object HP is measured by the electromagnetic wave measuring apparatus according to the first embodiment, a position (see FIG. 1) of the electromagnetic probe section 1 is previously adjusted in the Z-axis direction so as to be close to the object HP, thereby measuring an electromagnetic field distribution over the XY plane located at a fixed distance with respect to the Z-axis direction. Also, the XY plane is divided at predetermined spacings on the basis of X- and Y-axis coordinates. The electromagnetic wave measuring apparatus uses coordinates of an intersection point as measurement position coordinates $(x_i, y_j)$ (i and j are natural numbers), and measures a magnetic field level at each measurement position coordinate by moving the table top of the XY table 5. Note that the Y-axis coordinate in the first embodiment is divided in increments of the above-described pitch p, and the X-axis coordinate is divided in increments of a predetermined pitch.

In FIG. 5, the calculation processing section 3 sets a temporary variable i representing the X-axis coordinate in the flowchart to an initial value 1 (step S11). Then, the calculation processing section 3 sets a temporary variable j representing the Y-axis coordinate in the flowchart to an initial value 1 (step S12).

Next, based on the temporary valuables i and j, the calculation processing section 3 outputs table driving data TD for moving the object HP so that the electromagnetic probe section 1 coincides with the measurement position coordinates $(x_i, y_j)$, and provides a table driving instruction for the table driving section 4 (step S13).

Here, a positional relationship between the measurement position coordinates $(x_i, y_j)$ and the electromagnetic probe section 1 will be described. As described above, the XY plane is divided at predetermined spacings on the basis of X- and Y-axis coordinates, and the measurement position coordinates facing the electromagnetic probe section 1 can be changed by moving the table top of the XY table 5. In the case where the electromagnetic probe section 1 is placed at the measurement position coordinates $(x_i, y_j)$, the electromagnetic probe section 1 is placed so that a perpendicular line in the Z-axis direction, which passes through a midpoint m of a segment connecting loop centers of the loop probes 11a and 11b, intersects with the measurement position coordinates $(x_i, y_j)$. The loop probe 11c is placed so that its loop center is away from the midpoint m (that is, the measurement position coordinates $(x_i, y_j)$) by pitch p in a negative Y-axis direction. Hereinafter, three loop probes set for the measurement position coordinates $(x_i, y_j)$ are referred to as a loop probe 11a $(x_i, y_j)$, a loop probe 11b $(x_i, y_j)$, and a loop probe 11c $(x_i, y_j)$, respectively.

Next, the calculation processing section 3 receives the detection level information Da to Dc as magnetic field data on the measurement position coordinates $(x_i, y_j)$ (step S14). A process in step S14 is performed as follows: electromagnetic radiation detected by the loop probe 11a $(x_i, y_j)$, the loop probe 11b $(x_i, y_j)$, and the loop probe 11c $(x_i, y_j)$ are converted into induced electric signals; and the electromagnetic field level detection section 2 converts the induced electric signals into detection level information Da to Dc, and outputs the detection level information Da to Dc to the calculation processing section 3.

Next, the calculation processing section 3 stores the detection level information Da to Dc received in step S14 into a predetermined data table in the storing section 32 (step S15). Hereinafter, a method for storing the detection level information Da to Dc into the data table will be described with reference to FIGS. 6 and 7.

In FIG. 6, the electromagnetic probe section 1 is placed at the measurement position coordinates $(x_1, y_1)$, and the loop probe 11a $(x_1, y_1)$, the loop probe 11b $(x_1, y_1)$, and the loop probe 11c $(x_1, y_1)$ seen from the positive Z-axis direction, respectively, are shown in a solid line. The loop probe 11a $(x_1, y_1)$ and the loop probe 11b $(x_1, y_1)$ are placed so that a perpendicular line in the Z-axis direction, which passes through the midpoint m of a segment connecting the loop centers of the loop probes 11a and 11b, intersects with the measurement position coordinates $(x_1, y_1)$. Thus, the loop probes 11a $(x_1, y_1)$ and the loop probe 11b $(x_1, y_1)$ can detect magnetic field components parallel to the XY plane at the measurement position coordinates $(x_1, y_1)$. On the other hand, the loop probe 11c $(x_1, y_1)$ is placed so that its loop center is away from the midpoint m (that is, the measurement position coordinates $(x_1, y_1)$) by pitch p in the negative Y-axis direction. Thus, the loop probe 11c $(x_1, y_1)$ detects a magnetic field component in the Z-axis direction, which is perpendicular to the XY plane, at measurement position coordinates $(x_1, y_0)$ away from the measurement position coordinates $(x_1, y_1)$ by pitch pin the negative Y-axis direction. That is, in the case where the electromagnetic probe section 1 is placed at the measurement position coordinates $(x_1, y_1)$, the calculation processing section 3 receives detection level information Da $(x_1, y_1)$ and Db $(x_1, y_1)$, which are converted from the magnetic field components parallel to the XY plane at the measurement position coordinates $(x_1, y_1)$, and detection level information Dc $(x_1, y_1)$, which is converted from the magnetic field component in the Z-axis direction at the measurement position coordinates $(x_1, y_0)$.

Also, in FIG. 6, the electromagnetic probe section 1 is placed at the measurement position coordinates $(x_1, y_2)$ by moving the table top of the XY table 5 by pitch p in the negative Y-axis direction, and a loop probe 11a $(x_1, y_2)$, a loop probe 11b $(x_1, y_2)$, and a loop probe 11c $(x_1, y_2)$ seen from the positive Z-axis direction are shown in a dashed line. Note that, in an actual measurement, a position of the electromagnetic probe section 1 is fixed, and measurement position coordinates are moved. However, in the following descriptions, the measurement position coordinates are fixed, and the electromagnetic probe section 1 is moved in the positive Y-axis direction for the sake of simplicity. In this case, the loop probe 11a $(x_1, y_2)$ and the loop probe 11b $(x_1, y_2)$ can detect magnetic field components parallel to the XY plane at the measurement position coordinates $(x_1, y_2)$. Also, the loop probe 11c $(x_1, y_2)$ detects a magnetic field component in the Z-axis direction at the measurement position coordinates $(x_1, y_1)$ away from the measurement position coordinates $(x_1, y_2)$ by pitch p in the negative Y-axis direction. That is, the electromagnetic probe $(x_1, y_2)$ detects a magnetic field component in the Z-axis direction at the measurement position coordinates $(x_1, y_1)$, whereas the magnetic field components at the same measurement position coordinates $(x_1, y_1)$, which is parallel to the XY plane, have been already detected by the loop probes 11a $(x_1, y_1)$ and 11 $(x_1, y_1)$. Thus, in the case where the electromagnetic probe section 1 is placed at the measurement position coordinates $(x_i, y_j)$, the calculation processing section 3 receives detection level information Da $(x_i, y_j)$ and Db $(x_i, y_j)$, which are converted from the magnetic field components parallel to the XY plane at the measurement position coordinates $(x_i, y_j)$, and detection level information Dc $(x_i, y_{j-1})$, which is converted from the magnetic field component in the Z-axis direction at the measurement position coordinates $(x_i, y_{j-1})$.

In FIG. 7, the storing section 32 stores a data table, in which detection level information and magnetic field levels, which will be described below, are associated with the measurement position coordinates. As described above, the loop probes 11a to 11c detect different measurement position coordinates. Thus, the calculation processing section 3 stores in step S15 the detection level information Da to Dc in storage areas corresponding to the respective measurement position coordinates. That is, in the case where the electromagnetic probe section 1 is placed at the measurement position coordinates $(x_i, y_j)$, the calculation processing section 3 stores, as detection level information Da and Db detected and generated by the respective loop probes 11a and 11b, the detection level information Da $(x_i, y_j)$ and Db $(x_i, y_j)$ in the storing section 32 as data on the measurement position coordinate $(x_i, y_j)$, which is parallel to the XY plane. Then, as the detection level information Dc detected and generated by the loop probe 11c, the calculation processing section 3 stores the detection level information Dc $(x_i, y_{j-1})$ in the storing section 32 as data on the measurement position coordinates $(x_i, y_{j-1})$ in the Z-axis direction. That is, the calculation processing section 3 stores the detection level information Da and Db detected and generated by the loop probes 11a and 11b, and the detection level information Dc detected and generated by the loop probe 11c in the data table, in which the above detection level information are associated with different measurement position coordinates.

Next, the calculation processing section 3 determines whether or not the current temporary variable j is greater than 1 (step S16). If the current temporary variable j is equal to 1, the calculation processing section 3 cannot perform a process in step S17, which will be described below. Therefore, the calculation processing section 3 increments the temporary variable j by +1 in step S21, and goes back to step S13 for repeating the process. The calculation processing section 3 executes the above step S13 after executing the above step S21, thereby moving the table top of the XY table 5 by pitch p in the negative Y-axis direction. Also, if the current temporary variable j is greater than 1, the calculation processing section 3 proceeds to step S17.

In step S17, the calculation processing section 3 calculates a magnetic field level $D_{XYZ}$ using the detection level information Da to Dc stored in the storing section 32. The magnetic field level $D_{XYZ}$ represents an XYZ axis component, that is, a three-dimensional magnetic field level. The calculation processing section 3 calculates the magnetic field level $D_{XYZ}$ $(x_i, y_{j-1})$ at the measurement position coordinates $(x_i, y_{j-1})$ using the root sum square of the detection level information Da $(x_i, y_{j-1})$, Db $(x_i, y_{j-1})$, and Dc $(x_i, y_{j-1})$ which are associated with the measurement position coordinates $(x_i, y_{j-1})$ and stored in the data table. The calculation processing section 3 calculates the magnetic field level $D_{XYZ}$ $(x_i, y_{j-1})$ by the following equation:
[Equation 1]

$$D_{XYZ}(x_i, y_{j-1}) = \sqrt{\{D_a(x_i, y_{j-1})\}^2 + \{D_b(x_i, y_{j-1})\}^2 + \{D_c(x_i, y_{j-1})\}^2} \quad (1)$$

Then, the calculation processing section 3 stores the calculating results in the data table of the storing section 32.

Next, the calculation processing section 3 determines whether or not measurement in the Y-axis direction is completed with respect to the current X-axis coordinate $x_i$ (step S18). If the measurement in the Y-axis direction is not completed with respect to the X-axis coordinate $x_i$, the calculation processing section 3 increments the temporary variable j by +1 in step S21, and goes back to step S13 for repeating the process. Also, if the measurement in the Y-axis direction is completed with respect to the X-axis coordinate $x_i$, the calculation processing section 3 proceeds to step S19.

In step S19, the calculation processing section 3 determines whether or not the current X-axis coordinate $x_i$ is the last coordinate to be measured. If the X-axis coordinate $x_i$ is not the last coordinate to be measured, the calculation processing section 3 increments the temporary variable i by +1 in step S22, and goes back to step S12 for repeating the process. If the X-axis coordinate $x_i$ is the last coordinate to be measured, the calculation processing section 3 proceeds to step S20.

In step S20, the calculation processing section 3 calculates an electromagnetic field distribution over the measured XY plane using the magnetic field level $D_{XYZ}$ at each measurement position coordinate stored in the storing section 32, outputs the calculated electromagnetic field distribution to an output device (not shown), and ends the process of the flowchart. As described above, the magnetic field level $D_{XYZ}$ represents a three-dimensional magnetic field level at each measurement position coordinate, whereby it is possible to calculate with high-precision the electromagnetic field distribution of the object HP.

Note that the calculation processing section 3 may execute the above-described step S17 after it is determined in step S19 that the X-axis coordinate $x_i$ is the last coordinate to be measured. In this case, after all the detection level information Da to Dc are received, the calculation processing section 3 calculates the magnetic field levels $D_{XYZ}$ at the respective measurement position coordinates at once.

Also, even if a plurality of sets of the loop probes 11a to 11c are placed, it is possible to realize the above-described electromagnetic field distribution calculation process performed by the calculation processing section 3 by performing the same calculation operation to each of the plurality sets of the loop probes 11a to 11c. In this case, it is possible to concurrently measure the electromagnetic field distribution over a wide range of areas.

(Second Embodiment)

An electromagnetic wave measuring apparatus according to a second embodiment will be described. The electromagnetic wave measuring apparatus measures a wide range of electromagnetic field distribution with the minimum structure of a magnetic field detection probe and an electromagnetic field level detection section, and realizes size reduction of a driving system device by narrowing an area in which an object to be measured is moved. The structure of the electromagnetic wave measuring apparatus according to the second embodiment is identical to the electromagnetic wave measuring apparatus according to the first embodiment, which is described using FIG. 1, and therefore the detailed description thereof is hereinafter omitted. Also, the structures of the electromagnetic field level detection section 2 and the calculation processing section 3 of the electromagnetic wave measuring apparatus according to the second embodiment are identical to the structures of the electromagnetic field level detection section 2 and the calculation processing section 3 of the electromagnetic wave measuring apparatus according to the first embodiment, which is described using FIG. 4, and therefore the detailed description thereof is hereinafter omitted.

With reference to FIG. 8, a plurality of magnetic field detection probes of the electromagnetic probe section 1 provided in the electromagnetic wave measuring apparatus according to the second embodiment will be described. The magnetic field detection probe of the electromagnetic wave measuring apparatus is, for example, a loop probe as described in the first embodiment. FIG. 8 is a schematic illustration of the placement of the probes seen from the positive Z-axis direction (see FIG. 1) for describing an exemplary loop probe placement in the electromagnetic probe section 1. As described above, each loop probe is connected to the electromagnetic field level detection section 2 by a transmission line, and is secured to the supporting section 6 by the securing member. In the following descriptions, however, the transmission line and the securing member are omitted in FIG. 8 for the sake of simplicity.

In FIG. 8, the electromagnetic probe section 1 according to the second embodiment has nine loop probes 11a to 11i as the plurality of magnetic field detection probes, and also has eight dummy loop probes 12a to 12h. Based on Faraday's law, in theory, the loop probes 11a to 11i can detect a magnetic field with their loop-shaped conducting wires. The loop probes 11a to 11i show the maximum reception sensitivity to a magnetic field perpendicular to the loop plane and the reception sensitivity of the loop probes 11a to 11i becomes zero with respect to a magnetic field parallel to the loop plane. Each of the loop probes 11a to 11i is connected between a core wire of the transmission line, which is used for connection with the electric field level detection section 2 and is composed of a coaxial wire, and a ground. Hereinafter, the loop probes 11a to 11i are referred to as a loop probe 11 in the case where the loop probes 11a to 11i are described collectively.

The dummy loop probes 12a to 12h are used for enhancing symmetry of reception characteristics of the loop probes 11a to 11i, which is caused by electromagnetic field coupling. Each of the dummy loop probes 12a to 12h, which has the same structure as the loop probe 11, is not connected to a core wire of the transmission line, which is used for connection with the electric field level detection section 2 and is composed of a coaxial wire. That is, the electromagnetic field level detection section 2 is not connected to the dummy loop probes 12a to 12h, and does not receive an electric signal therefrom.

The loop planes of the loop probe 11a and 11b are placed so as to be parallel to the Z-axis of FIG. 8. The loop planes of the loop probes 11a and 11b form an angle of 90 degrees, and each forms an angle of 45 degrees with the X-axis of FIG. 8. A distance between loop centers of the loop probes 11a and 11b is pitch p, and the loop probes 11a and 11b are placed so that their respective magnetic field detection spaces are not interfered with by other loop probes. That is, seen from the positive Z-axis direction, the loop probes 11a and 11b forms a shape like non-parallel sides of a trapezoid.

The loop plane of the loop probe 11c is placed so as to be parallel to the XY plane. That is, the loop plane of the loop probe 11c is placed so as to be perpendicular to the loop planes of the loop probes 11a and 11b. A loop center of the loop probe 11c is placed on a perpendicular line passing through a midpoint m1 of a segment connecting the loop centers of the loop probes 11a and 11b, and a distance between the loop center of the loop probe 11c and the segment connecting the loop centers of the loop probes 11a and 11b is pitch p. The loop probe 11c is placed so that its magnetic field detection space is not interfered with by other loop probes 11a and 11b (see also FIG. 3C).

The loop planes of the loop probes 11a to 11c are placed so as to be perpendicular to each other, whereby it is possible to detect a three-dimensional magnetic field. Specifically, a magnetic field component parallel to the XY plane is detected by the loop probes 11a and 11b, and a magnetic field component in the Z-axis direction is detected by the loop probe 11c. Furthermore, the loop planes of the loop probes 11a and 11b form an angle of 90 degrees, the loop plane of the loop probe 11c is formed so as to be perpendicular to the loop planes of the loop probes 11a and 11b, and each loop probe is placed so that its magnetic field detection space is not interfered with by other loop probes. As a result, it is possible to minimize the occurrence of coupling between the adjacent loop probes 11a to 11c.

Furthermore, the loop probe 11d is placed so that its loop plane lies on the same plane as the loop plane of the loop probe 11c, and its loop center is away from the loop center of the loop probe 11c by pitch p in the positive X-axis direction and by pitch 2p in the positive Y-axis direction. That is, the loop plane of the loop probe 11d is placed so as to be parallel to the XY plane, and the loop center thereof is placed so as to be away from the midpoint m1 by pitch p in the positive X-axis direction and by pitch p in the positive Y-axis direction, thereby detecting a magnetic field component in the Z-axis direction. The loop probe 11d is placed so that the loop probes 11d and 11c are plane-symmetric with respect to the loop plane of a loop probe 11b, whereby the magnetic field detection space of the loop probe 11d is not interfered with by other loop probes 11a to 11c.

Positional relationships of the loop probes 11e to 11h are similar to the positional relationship of the loop probes 11a to 11d. A midpoint m3 of a segment connecting the loop centers of the loop probes 11e and 11f is placed so as to be away from the midpoint m1 by pitch 4p in the positive X-axis direction. That is, the loop probes 11e to 11h are placed in respective positions, to which the loop probes 11a to 11d are translated by pitch 4p in the positive X-axis direction, respectively. Thus, the loop probes 11e and 11f detect magnetic field components parallel to the XY plane, and the loop probes 11g and 11h detect magnetic field components in the Z-axis direction.

The loop probe 11i is placed so that its loop plane is parallel to the loop planes of the loop probes 11a and 11e, and its loop center is away from the loop center of the loop probe 11e by pitch 4p in the positive X-axis direction. That is, the loop probe 11i is placed in a position to which the loop probe 11e is translated by pitch 4p in the positive X-axis direction. Thus, the loop probe 11i detects a magnetic field component parallel to the XY plan.

Positional relationships of dummy loop probes 12a to 12d are similar to the positional relationship of the loop probes 11a to 11d. A midpoint m2 of a segment connecting the loop centers of the loop probes 12a and 12b is placed so as to be away from the midpoint m1 by pitch 2p in the positive X-axis direction. That is, the dummy loop probes 12a to 12d are placed in respective positions, to which the loop probes 11a to 11d are translated by pitch 2p in the positive X-axis direction, respectively.

Positional relationships of the dummy loop probes 12e to 12h are similar to the positional relationship of the loop probes 11e to 11h. A midpoint m4 of a segment connecting the loop centers of the dummy loop probes 12e and 12f is placed so as to be away from the midpoint m3 by pitch 2p in the positive X-axis direction. That is, the dummy loop probes 12e to 12h are placed in respective positions, to which the loop probes 11e to 11h are translated by pitch 2p in the positive X-axis direction.

As such, it is possible to ensure isolation between the loop probes 11a to 11d, the loop probes 11e to 11h, and the loop probe 11i by keeping enough distance therebetween. Also, the dummy loop probes 12a to 12d are placed in a point located midway between the loop probes 11a to 11d and the loop probes 11e to 11h, and the dummy loop probes 12e to 12h are placed in a point located midway between the loop probes 11e to 11h and the loop probe 11i, whereby it is possible to enhance symmetry of reception characteristics, which is caused by electromagnetic field coupling, of the magnetic field levels detected by the loop probes 11a to 11i.

Figure 9:
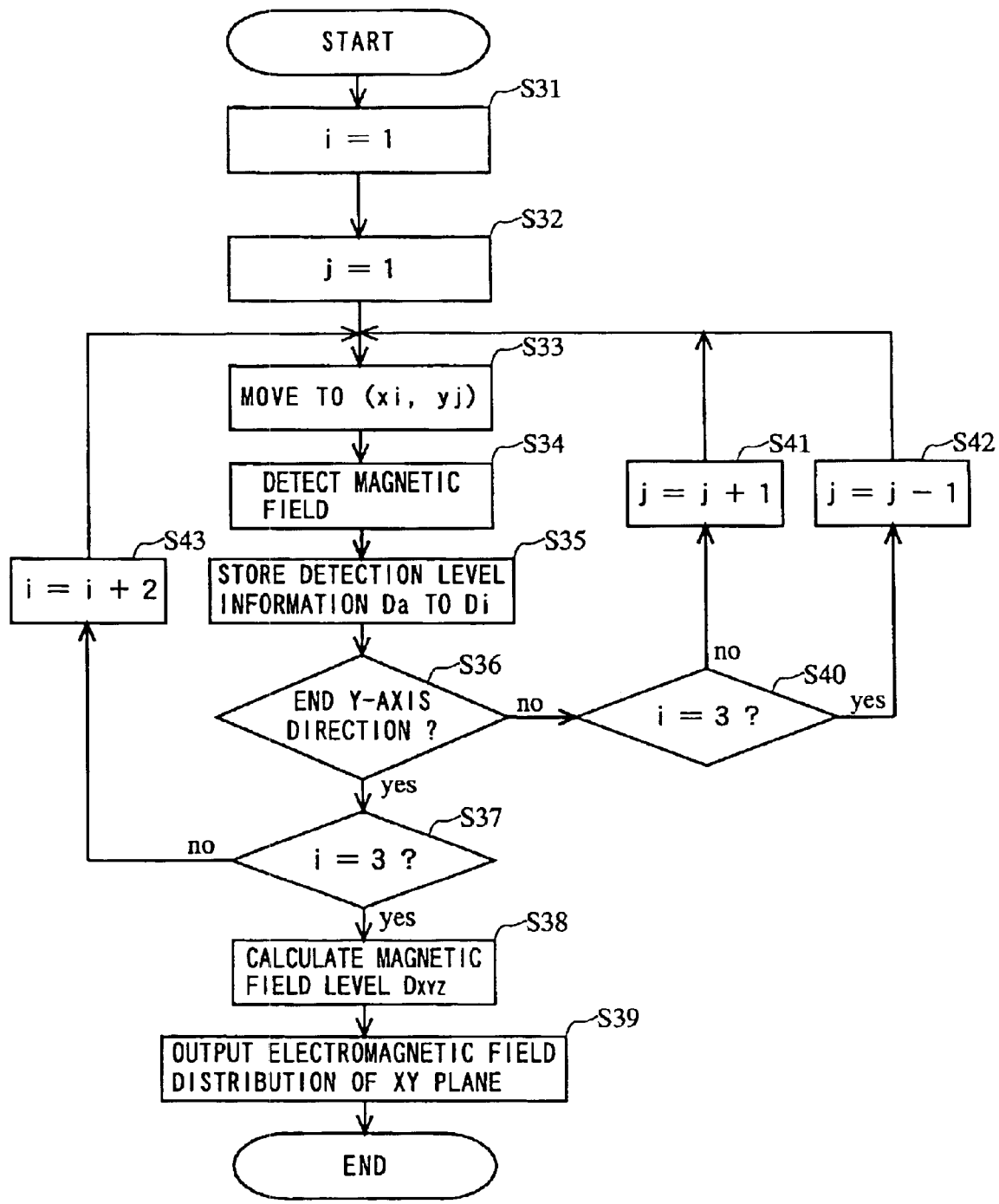
FIG. 9 is a flowchart showing an electromagnetic field distribution calculation process performed by the calculation processing section 3 according to the second embodiment of the present invention.
Figure 10:
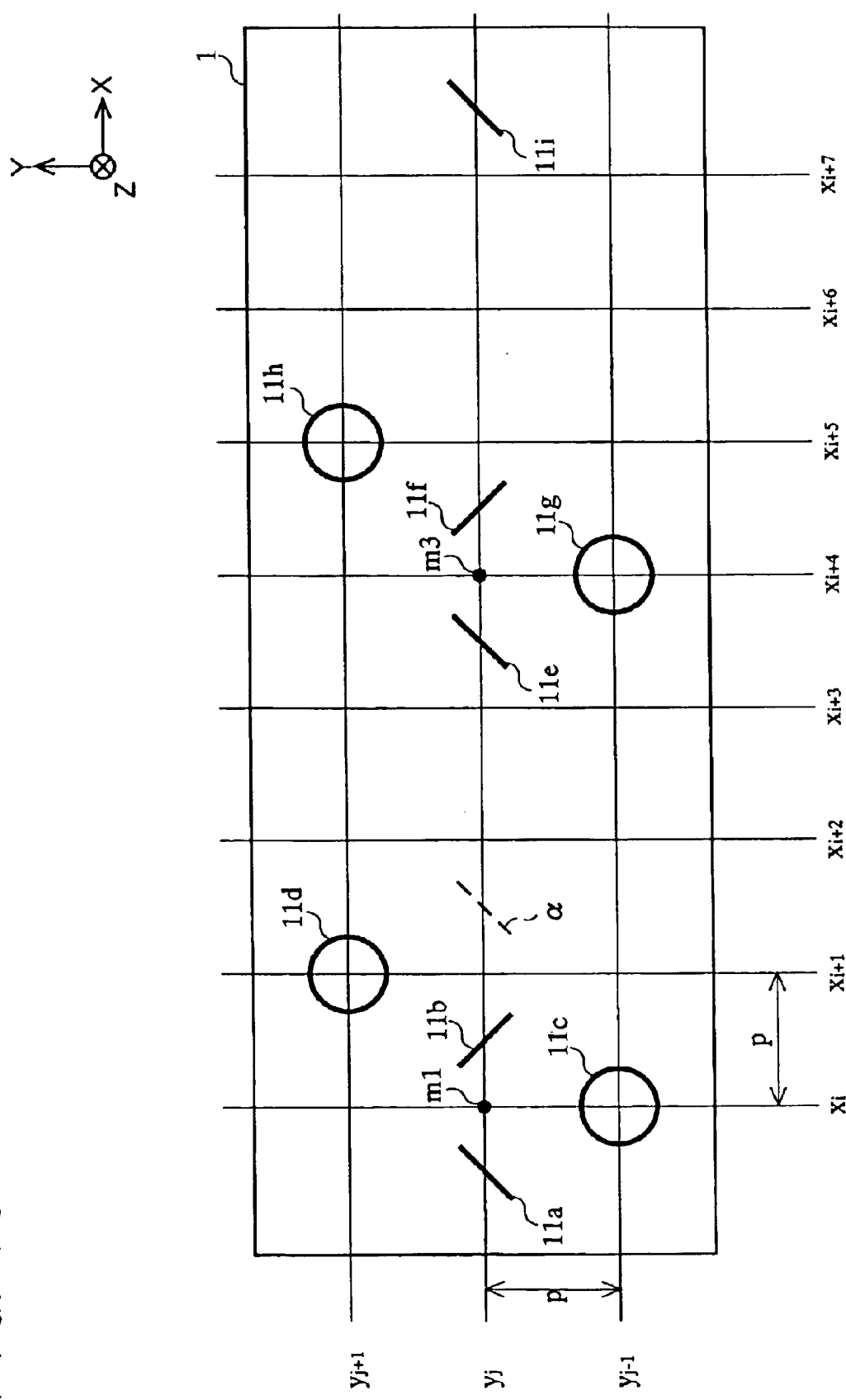
FIG. 10 is a schematic illustration for describing positions of loop probes 11a to 11i when the calculation processing section 3 according to the second embodiment of the present invention moves the object HP.

Next, with reference to FIGS. 9 to 12, an electromagnetic field distribution calculation process performed by the calculation processing section 3 of the second embodiment will be described. FIG. 9 is a flowchart showing the electromagnetic field distribution calculation process performed by the calculation processing section 3. FIG. 10 is a schematic illustration for describing positions of the loop probes 11a to 11i when the calculation processing section 3 moves the object HP. FIG. 11 is an illustration for describing an exemplary data table stored in the storing section 32. FIG. 12 is an illustration for describing a reference used when detection level information is written into the data table. In the following descriptions, it is assumed that the plurality of magnetic field detection probes of the electromagnetic probe section 1 are the above-described nine loop probes 11a to 11i.

When an electromagnetic field distribution of the object HP is measured by the electromagnetic wave measuring apparatus according to the second embodiment, a position (see FIG. 1) of the electromagnetic probe section 1 is previously adjusted in the Z-axis direction so as to be close to the object HP, thereby measuring an electromagnetic field distribution over the XY plane located at a fixed distance with respect to the Z-axis direction. Also, the XY plane is divided at predetermined spacings on the basis of X- and Y-axis coordinates. The electromagnetic wave measuring apparatus uses coordinates of an intersection point as measurement position coordinates $(x_i, y_j)$ (i and j are natural numbers), and measures a magnetic field level at each measurement position coordinate by moving the table top of the XY table 5.

In FIG. 9, the calculation processing section 3 sets a temporary variable i representing the X-axis coordinate in the flowchart to an initial value 1 (step S31). Then, the calculation processing section 3 sets a temporary variable j representing the Y-axis coordinate in the flowchart to an initial value 1 (step S32).

Next, based on the temporary valuables i and j, the calculation processing section 3 outputs table driving data TD for moving the object HP so that the electromagnetic probe section 1 coincides with the measurement position coordinates $(x_i, y_j)$, and provides a table driving instruction for the table driving section 4 (step S33).

Here, with reference to FIG. 10, a positional relationship between the measurement position coordinates $(x_i, y_j)$ and the electromagnetic probe section 1 will be described. As described above, the XY plane is divided by pitch p on the basis of X- and Y-axis coordinates, and the measurement position coordinates facing the electromagnetic probe section 1 can be changed by moving the table top of the XY table 5. In the case where the electromagnetic probe section 1 is placed at the measurement position coordinates $(x_i, y_j)$, the electromagnetic probe section 1 is placed so that a perpendicular line in the Z-axis direction, which passes through the midpoint m1 of a segment connecting the loop centers of the loop probes 11a and 11b, intersects with the measurement position coordinates $(x_i, y_j)$. In this case, a loop center of the loop probe 11c, which is away from the midpoint m1 by pitch p in the negative Y-axis direction, is placed at measurement position coordinates $(x_i, y_{j-1})$. A loop center of the loop probe 11d, which is away from the midpoint m1 by pitch p in the positive X-axis direction, is placed at measurement position coordinates $(x_{i+1}, y_{j+1})$. Also, a midpoint m3 of a segment connecting the loop centers of the loop probes 11e and 11f, which is away from the midpoint m1 by pitch 4p in the positive X-axis direction, is placed at measurement position coordinates $(x_{i+4}, y_j)$. A loop center of the loop probe 11g, which is away from the midpoint m3 by pitch p in the negative Y-axis direction, is placed at measurement position coordinates $(x_{i+4}, y_{j-1})$. A loop center of the loop probe 11h, which is away from the midpoint m3 by pitch p in the positive X-axis direction and by pitch p in the positive Y-axis direction, is placed at measurement position coordinates $(x_{i+5}, y_{j+1})$. Furthermore, a loop center of the loop probe 11i, which is away from the loop center of the loop probe 11e by pitch 4p in the positive X-axis direction, is placed at an intermediate point between the measurement position coordinates $(x_{i+7}, y_j)$ and the measurement position coordinates $(x_{i+8}, y_j)$. Hereinafter, in the case where the electromagnetic probe section 1 is placed at the measurement position coordinates $(x_i, y_j)$, the nine loop probes 11a to 11i will be described with the coordinates $(x_i, y_j)$ assigned thereto.

Next, the calculation processing section 3 receives detection level information Da to Di as magnetic field data on the measurement position coordinates $(x_i, y_j)$ (step S34). A process in step S34 is performed as follows: electromagnetic radiation detected by the loop probes 11a $(x_i, y_j)$ to 11i $(x_i, y_j)$ are converted into induced electric signals; and the electromagnetic field level detection section 2 converts the induced electric signals into detection level information Da to Di, and outputs the detection level information Da to Di to the calculation processing section 3.

Next, the calculation processing section 3 stores the detection level information Da to Di received in step S34 into a predetermined data table in the storing section 32 (step S35). Hereinafter, a method for storing the detection level information Da to Di into the data table will be described with reference to FIGS. 10 to 12.

First, with reference to FIG. 10, magnetic field components detected by the loop probes 11a $(x_i, y_j)$ to 11i $(x_i, y_j)$ will be described. The midpoint m1 of a segment connecting the loop centers of the loop probes 11a $(x_i, y_j)$ and 11b $(x_i, y_j)$ is placed at the measurement position coordinates $(x_i, y_j)$. Thus, the loop probes 11a $(x_i, y_j)$ and 11b $(x_i, y_j)$ detect magnetic field components parallel to the XY plane at the measurement position coordinates $(x_i, y_j)$. The loop probe 11c $(x_i, y_j)$, whose loop center is placed at the measurement position coordinates $(x_i, y_{j-1})$, detects a magnetic field component in the Z-axis direction at the measurement position coordinates $(x_i, y_{j-1})$. The loop probe 11d $(x_i, y_j)$, whose loop center is placed at the measurement position coordinates $(x_{i+1}, y_{j+1})$, detects a magnetic field component in the Z-axis direction at the measurement position coordinates $(x_{i+1}, y_{j+1})$. The midpoint m3 of a segment connecting the loop centers of the loop probes 11e $(x_i, y_j)$ and 11f $(x_i, y_j)$ is placed at the measurement position coordinates $(x_{i+4}, y_j)$. Thus, the loop probes 11e $(x_i, y_j)$ and 11f $(x_i, y_j)$ detect magnetic field components parallel to the XY plane at the measurement position coordinates $(x_{i+4}, y_j)$. The loop probe 11g $(x_i, y_j)$, whose loop center is placed at the measurement position coordinates $(x_{i+4}, y_{j-1})$, detects a magnetic field component in the Z-axis direction at the measurement position coordinates $(x_{i+4}, y_{j-1})$. The loop probe 11h $(x_i, y_{j-1})$, whose loop center is placed at the measurement position coordinates $(x_{i+5}, y_{j+1})$, detects a magnetic field component in the Z-axis direction at the measurement position coordinates $(x_{i+5}, y_{j+1})$.

Here, the loop probe 11b $(x_i, y_j)$ will be described in detail. In the case where an additional loop probe (in FIG. 10, a loop probe α) is placed, and the loop probe 11b $(x_i, y_j)$ and the loop probe α are plane-symmetric with respect to a YZ plane located at the X-axis coordinate $X_{i+1}$, a midpoint of a segment connecting the loop centers of the loop probe 11b $(x_i, y_j)$ and the loop probe α falls on the measurement position coordinates $(x_{i+1}, y_j)$. Thus, the loop probe 11b $(x_i, y_j)$ concurrently detects magnetic field components, which are parallel to the XY plane, of the measurement position coordinates $(x_i, y_j)$ and $(x_{i+1}, y_j)$. The loop probes detecting a magnetic field component parallel to the XY plane (the loop probes 11a, 11b, 11e, 11f, and 11i) concurrently detect magnetic field components at two measurement position coordinates. That is, by the loop probes 11a, 11b, 11e, 11f, and 11i, magnetic field components parallel to the XY plane are concurrently detected at two coordinates, whose intermediate point coincides with a position in which each of the above loop probes is placed.

In FIG. 11, the storing section 32 stores the data table, in which detection level information and magnetic field levels are associated with the measurement position coordinates. In the data table used in the second embodiment, the detection level information are classified according to a detected magnetic field direction of each loop probe 11 detecting the detection level information. Specifically, the detection level information Da, De, and Di, which are detected by the respective loop probes 11a, 11e, and 11i, belong to a first group, and the detection level information Db and Df, which are detected by the respective loop probes 11b and 11f, belong to a second group. The detection level information Dc, Dd, Dg and Dh, which are detected by the respective loop probes 11c, 11d, 11g and 11h, belong to a third group. As described above, the loop probes 11a to 11i detect different measurement position coordinates. Thus, the calculation processing section 3 stores, in step S35, the detection level information Da to Di in the areas corresponding to the respective measurement position coordinates in accordance with the reference shown FIG. 12.

Specifically, the calculation processing section 3 associates the information obtained from the loop probe 11a ($x_i$, $y_j$) with the respective measurement position coordinates for storing in the first group of the data table as detection level information Da ($x_{i-1}$, $y_j$) and Da ($x_i$, $y_j$), which are converted from the respective magnetic field components, which are parallel to the XY plane with, of the measurement position coordinates ($x_{i-1}$, $y_j$) and ($x_i$, $y_j$). The calculation processing section 3 associates the information obtained from the loop probe 11b ($x_i$, $y_j$) with the respective measurement position coordinates for storing in the second group of the data table as detection level information Db ($x_i$, $y_j$) and Db ($x_{i+1}$, $y_{j-1}$), which are converted from the respective magnetic field components, which are parallel to the XY plane, of the measurement position coordinates ($x_i$, $y_j$) and ($x_{i+1}$, $y_j$). The calculation processing section 3 associates the information obtained from the loop probe 11c ($x_i$, $y_j$) with the measurement position coordinates for storing in the third group of the data table as detection level information Dc ($x_i$, $y_{j-1}$), which is converted from the magnetic field component in the Z-axis direction of the measurement position coordinates ($x_i$, $y_{j-1}$). The calculation processing section 3 associates the information obtained from the loop probe 11d ($x_i$, $y_j$) with the measurement position coordinates for storing in the third group of the data table as detection level information Dd ($x_{i+1}$, $y_{j+1}$), which is converted from the magnetic field component in the Z-axis direction of the measurement position coordinates ($x_{i+1}$, $y_{j+1}$).

Also, the calculation processing section 3 associates the information obtained from the loop probe 11e ($x_i$, $y_j$) with the respective measurement position coordinates for storing in the first group of the data table as detection level information De ($x_{i+3}$, $y_j$) and De ($x_{i+4}$, $y_j$), which are converted from the respective magnetic field components, which are parallel to the XY plane, of the measurement position coordinates ($x_{i+3}$, $y_j$) and ($x_{i+4}$, $y_j$). The calculation processing section 3 associates the information obtained from the loop probe 11f ($x_i$, $y_j$) with the respective measurement position coordinates for storing in the second group of the data table as detection level information Df ($x_{i+4}$, $y_j$) and Df ($x_{i+5}$, $y_j$), which are converted from the respective magnetic field components, which are parallel to the XY plane, of the measurement position coordinates ($x_{i+4}$, $y_j$) and ($x_{i+5}$, $y_j$). The calculation processing section 3 associates the information obtained from the loop probe 11g ($x_i$, $y_j$) with the measurement position coordinates for storing in the third group of the data table as detection level information Dg ($x_{i+4}$, $y_{j-1}$), which is converted from the magnetic field component in the Z-axis direction of the measurement position coordinates ($x_{i+4}$, $y_{j-1}$). The calculation processing section 3 associates the information obtained from the loop probe 11h ($x_i$, $y_j$) with the measurement position coordinates for storing in the third group of the data table as detection level information Dh ($x_{i+5}$, $y_{j+1}$), which is converted from the magnetic field component in the Z-axis direction of the measurement position coordinates ($x_{i+5}$, $y_{j+1}$). Furthermore, the calculation processing section 3 associates the information obtained from the loop probe 11i ($x_i$, $y_j$) with the respective measurement position coordinates for storing in the first group of the data table as detection level information Di ($x_{i+7}$, $y_j$) and Di ($x_{i+8}$, $y_j$), which are converted from the respective magnetic field components, which are parallel to the XY plane, of the measurement position coordinates ($x_{i+7}$, $y_j$) and ($x_{i+8}$, $y_j$).

Next, the calculation processing section 3 determines whether or not measurement in the Y-axis direction is completed with respect to the current X-axis direction coordinate $x_i$ (step S36). If the measurement in the Y-axis direction is not completed with respect to the current X-axis direction coordinate $x_i$, the calculation processing section 3 proceeds to step S40. If the measurement in the Y-axis direction is completed with respect to the current X-axis direction coordinate $x_i$, the calculation processing section 3 proceeds to step S37.

In step S40, the calculation processing section 3 determines whether or not the current temporary variable i is equal to 3. If the current temporary variable i is not equal to 3, the calculation processing section 3 proceeds to step S41. If the current temporary variable i is equal to 3, the calculation processing section 3 proceeds to step S42.

In step S41, the calculation processing section 3 increments the temporary variable j by +1, and goes back to step S33 for repeating the process. The calculation processing section 3 executes the above-described step S33 after executing the above-described step S41, thereby moving the table top of the XY table 5 by pitch p in the negative Y-axis direction. That is, the electromagnetic probe section 1 moves by pitch p in the negative Y-axis direction with respect to the measurement position coordinates. Hereinafter, the above movement is referred to as an outward movement.

On the other hand, in step S42, the calculation processing section 3 decrements the temporary variable j by −1, and goes back to step S33 for repeating the process. The calculation processing section 3 executes the above-described step S33 after executing the above-described step S42, thereby moving the table top of the XY table 5 by pitch p in the positive Y-axis direction. That is, the electromagnetic probe section 1 moves by pitch p in the positive Y-axis direction with respect to the measurement position coordinates. Hereinafter, the above movement is referred to as a homeward movement.

In step S37, the calculation processing section 3 determines whether or not the current temporary variable i is equal to 3. If the current temporary variable i is not equal to 3, the calculation processing section 3 proceeds to step S43. If the current temporary variable i is equal to 3, the calculation processing section 3 proceeds to step S38.

In step S43, the calculation processing section 3 increments the temporary variable j by +2, and goes back to step S33 for repeating the process. The calculation processing section 3 executes the above-described step S33 after executing the above-described step S43, thereby moving the table top of the XY table 5 by pitch 2p in the negative X-axis direction. That is, the electromagnetic probe section 1 moves by pitch 2p in the positive X-axis direction with respect to the measurement position coordinates.

Here, the above-described steps S43 and S42 will be described in detail. As described above, in step S42, a process for performing the homeward movement, in which the electromagnetic probe section 1 moves by pitch p in the negative Y-axis direction with respect to the measurement position coordinates, is performed after execution of step S43. That is, the electromagnetic probe section 1 performs the outward movement by pitch p. After reaching a predetermined end point, the electromagnetic probe section 1 moves by pitch 2p in the positive X-axis direction, and performs the homeward movement by pitch p. For example, if the electromagnetic probe section 1 passes through the positions of the loop probes 11a to 11 as shown in FIG. 10 during the outward movement, the midpoints m1 and m3 are shifted, during the homeward movement, on the X-axis coordinates $x_{i+2}$ and $x_{i+6}$, respectively, in the negative Y-axis direction. That is, an area in which the dummy loop probes 12a to 12h are placed in FIG. 8 is measured by the homeward movement, whereby it is possible to measure the magnetic fields of the measurement position coordinates efficiently and properly by the outward and homeward movements. Note that the detection level information enclosed by a double line as shown in FIG. 11 is data measured by the homeward movement.

In step S38, the calculation processing section 3 calculates a magnetic field level $D_{XYZ}$ using the detection level information Da to Di stored in the storing section 32. The magnetic field level $D_{XYZ}$ represents an XYZ axis component, that is, a three-dimensional magnetic field level. For the sake of simplification of descriptions, as shown at the bottom of FIG. 11, the detection level information Da ($x_i$, $y_j$), De ($x_i$, $y_j$), and Di ($x_i$, $y_j$), which belong to the first group, are collectively defined as detection level information Dx ($x_i$, $y_j$), the detection level information Db ($x_i$, $y_j$) and Df ($x_i$, $y_j$), which belong to the second group, are collectively defined as detection level information $D_Y$ ($x_i$, $y_j$), and the detection level information Dc ($x_i$, $y_j$), Dd ($x_i$, $y_j$), Dg ($x_i$, $y_j$), and Dh ($x_i$, $y_j$), which belong to the third group, are collectively defined as detection level information $D_Z$ ($x_i$, $y_j$). The calculation processing section 3 calculates the magnetic field level $D_{XYZ}$ ($x_i$, $y_j$) at the measurement position coordinates ($x_i$, $y_j$) using the root sum square of the detection level information $D_X$ ($x_i$, $y_j$), $D_Y$ ($x_i$, $y_j$), and $D_Z$ ($x_i$, $y_j$) which are associated with the measurement position coordinates ($x_i$, $y_j$) and stored in the data table. The calculation processing section 3 sequentially calculates all the magnetic field levels $D_{XYZ}$ ($x_i$, $y_j$) by the following equation:
[Equation 2]

$$D_{XYZ}(x_i, y_j) = \sqrt{\{D_a(x_i, y_j)\}^2 + \{D_b(x_i, y_j)\}^2 + \{D_c(x_i, y_j)\}^2} \qquad (2)$$

Then, the calculation processing section 3 stores the calculating results in the data table of the storing section 32.

Next, the calculation processing section 3 calculates an electromagnetic field distribution over the measured XY plane using the magnetic field level $D_{XYZ}$ at each measurement position coordinate stored in the storing section 32, outputs the calculated electromagnetic field distribution to an output device (not shown) (step S39), and ends the process of the flowchart.

As described above, the magnetic field level $D_{XYZ}$ represents a three-dimensional magnetic field level at each measurement position coordinate, whereby it is possible to calculate with high-precision the electromagnetic field distribution of the object HP. Also, according to the electromagnetic wave measuring apparatus of the second embodiment, it is possible to calculate the electromagnetic field distribution of all the eight measurement position coordinates $x_{i\ to\ xi+7}$, which are placed in the X-axis direction, by one reciprocating movement (outward and homeward movements). Also, a three-dimensional electromagnetic field distribution over the wide range of areas can be measured by nine loop probes, whereby it is possible to simplify the structure of the apparatus, which result in a substantial cost reduction. Furthermore, it is possible to measure an area of pitch 7p in the X-axis direction only by moving the electromagnetic probe section 1 by pitch 2p in the X-axis direction, thereby realizing size reduction of the driving system device for moving the table on which the object HP is mounted.

In the above-described second embodiment, measurement of electromagnetic waves is completed by one reciprocating movement. However, after the above reciprocating movement, similar measurement operations may be continued by changing the position of the object HP in order to measure electromagnetic waves in different areas in the positive X-axis direction.

(Third Embodiment)

An electromagnetic wave measuring apparatus according to a third embodiment will be described. The electromagnetic wave measuring apparatus, which measures a high-precision magnetic field distribution over a wide range of areas using a high-precision magnetic field detection probe, realizes size reduction of the driving system device by narrowing an area in which the object HP is moved. The structure of the electromagnetic wave measuring apparatus according to the third embodiment is identical to the structure of the electromagnetic wave measuring apparatus according to the first embodiment, which has been described using FIG. 1, and the therefore detailed description thereof is hereinafter omitted. Also, the structures of the electromagnetic field level detection section 2 and the calculation processing section 3 of the electromagnetic wave measuring apparatus according to the third embodiment are similar to the structures of the electromagnetic field level detection section 2 and the calculation processing section 3 according to the first embodiment, which have been described using FIG. 4, and therefore the detailed description thereof is hereinafter omitted.

Figure 13:
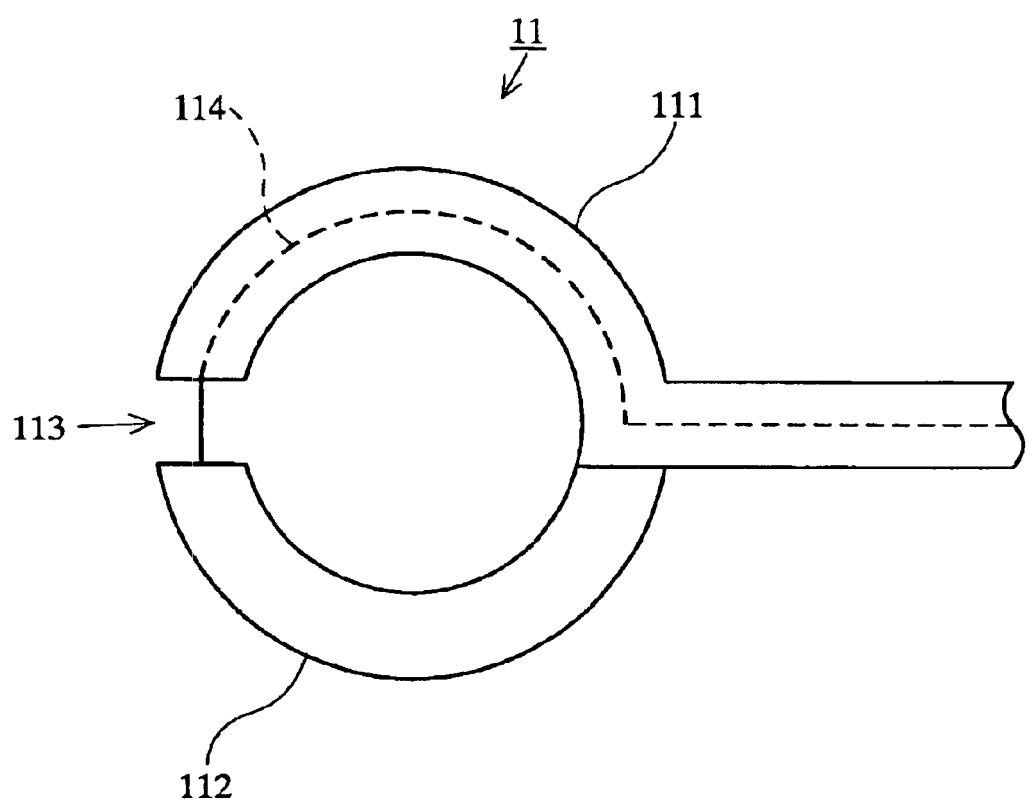
FIG. 13 is a schematic illustration for describing the structure of a magnetic field detection probe used in the electromagnetic wave measuring apparatus according to a third embodiment of the present invention.

With reference to FIG. 13, a magnetic field detection probe used in the electromagnetic wave measuring apparatus according to the third embodiment will be described. As is the case with the first embodiment, the magnetic field detection probe used in the third embodiment is a loop probe. The loop probe used in the third embodiment differs from the loop probe of the first embodiment in that it has a shielded structure, thereby realizing high-precision magnetic field detection. Based on Faraday's law, in theory, a loop probe can detect a magnetic field with its loop-shaped conducting wire. In this case, however, a loop probe having a loop-shaped conducting wire detects not only a magnetic field but also an electric field, whereby it is impossible to detect only a magnetic field with precision. Thus, as shown in FIG. 13, the loop probe 11 used in the third embodiment has a coaxial tube section 111 and a copper wire section 112. The coaxial tube section 111 forms a semicircle of the loop probe 11 by, for example, bending a tip of the transmission line, which is used for connection with the electromagnetic field level detection section 2 and is composed of a 50-ohm coaxial tube of ϕ1 mm, into a shape like a semicircle, and functions as a feeding point for detecting electromagnetic waves. On the other hand, the copper wire section 112 forms semicircle of the loop probe 11 by bending a copper wire having the same wire diameter of the coaxial tube section 111 into a shape like a semicircle. One end of the copper wire section 112 is soldered to a bending point of the coaxial tube section 111 (that is, a point from which the transmission line is bent to form a semicircle of the loop probe 11). A predetermined space (e.g., 0.5 mm) is left between the other end of the copper wire section 112 and the tip of the coaxial tube section 111, whereby a gap 113 is formed. A core wire 114 of the coaxial tube section 111 is exposed at the tip of the coaxial tube section 111, and the core wire 114 is soldered to other end of the copper wire section 112 across the gap 113.

Figure 14A:
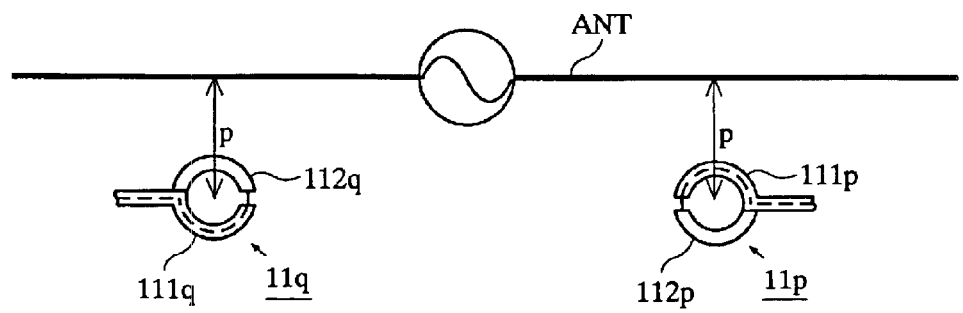
FIG. 14A is a schematic illustration showing an experimental model for describing characteristics of a loop probe 11 of FIG. 13.
Figure 14B:
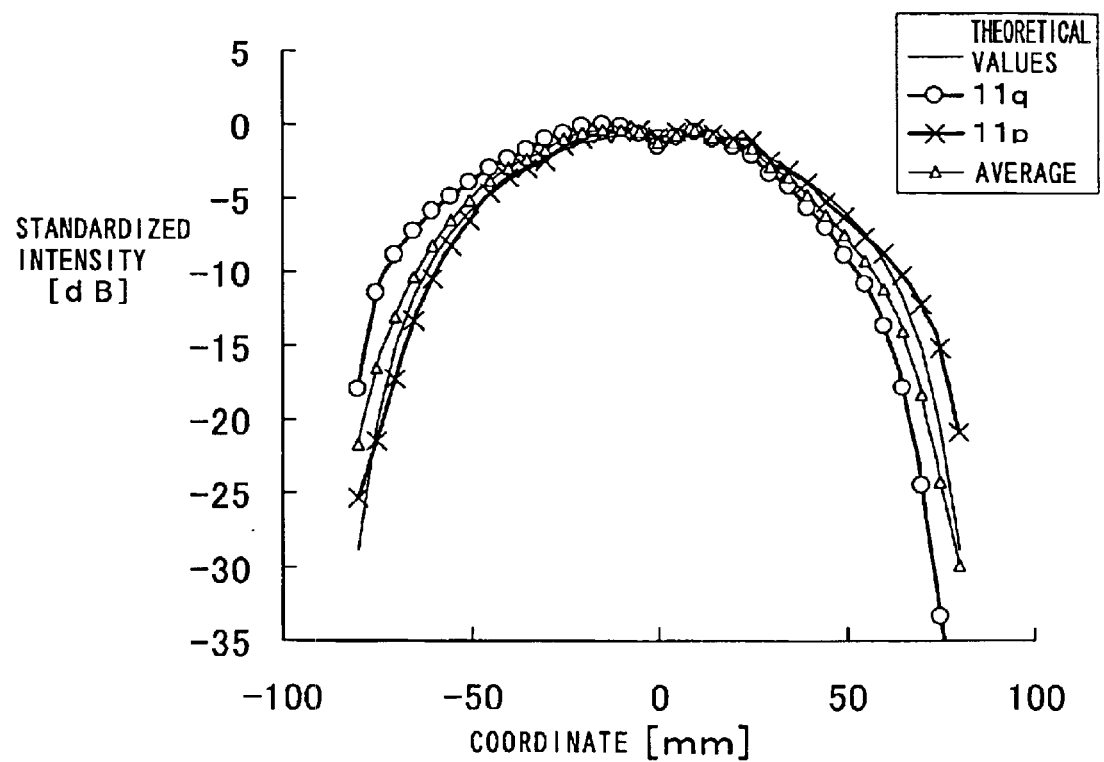
FIG. 14B is a graph showing magnetic field distribution characteristics obtained by the loop probe 11 of FIG. 13.

With reference to FIG. 14, characteristics of the above-described loop probe 11 will be described. FIG. 14A is a schematic illustration showing an experimental model for verifying the magnetic field distribution characteristics obtained by the loop probe 11. FIG. 14B is a graph showing magnetic field distribution characteristics obtained by the loop probe 11.

In FIG. 14A, the experimental model for verifying the magnetic field distribution characteristics obtained by the loop probe 11 measures a magnetic field distribution at 900 MHz using a λ/2 dipole antenna ANT, and compares a loop probe 11p whose coaxial tube section 111p lies closer to the dipole antenna ANT than the copper wire section 112p, and the loop probe 11q whose copper wire section 112q lies closer to the dipole antenna ANT than the coaxial tube section 111q. Measurement points for a magnetic field distribution are loop centers of the loop probes 11p and 11q. The loop probes 11p and 11q are placed in the respective positions away from the dipole antenna ANT by pitch p, and are moved in a horizontal direction in FIG. 14, thereby measuring a standardized intensity (dB) at each coordinate.

The magnetic field distributions measured by the loop probes 11p and 11q are shown in FIG. 14B. As shown in FIG. 14B, the magnetic field distributions measured by the loop probes 11p and 11q are asymmetrical. Specifically, the measurement result obtained by the loop probe 11p (shown by a cross mark (x) in FIG. 14B) shows a distribution skewed to the right, and the measurement result obtained by the loop probe 11q (shown by a circle mark (○) in FIG. 14B) shows a distribution skewed to the left. These skewed distributions are caused by the influence of electric fields due to the shape of the loop probe 11. Here, the above-described asymmetry can be cancelled by performing an averaging process for the magnetic field distributions measured by the loop probes 11p and 11q (a triangle mark (Δ) shown in FIG. 14B). This magnetic field distribution, which is obtained by performing the averaging process for the magnetic field distributions measured by the loop probes 11p and 11q, has reception characteristics which are largely similar to theoretical values. As such, the loop probe 11 has a shielded structure, and an averaging process is performed for the magnetic field distribution obtained by the loop probe 11, whereby a high-precision magnetic field distribution can be obtained with limited influence from the electric fields.

Figure 15:
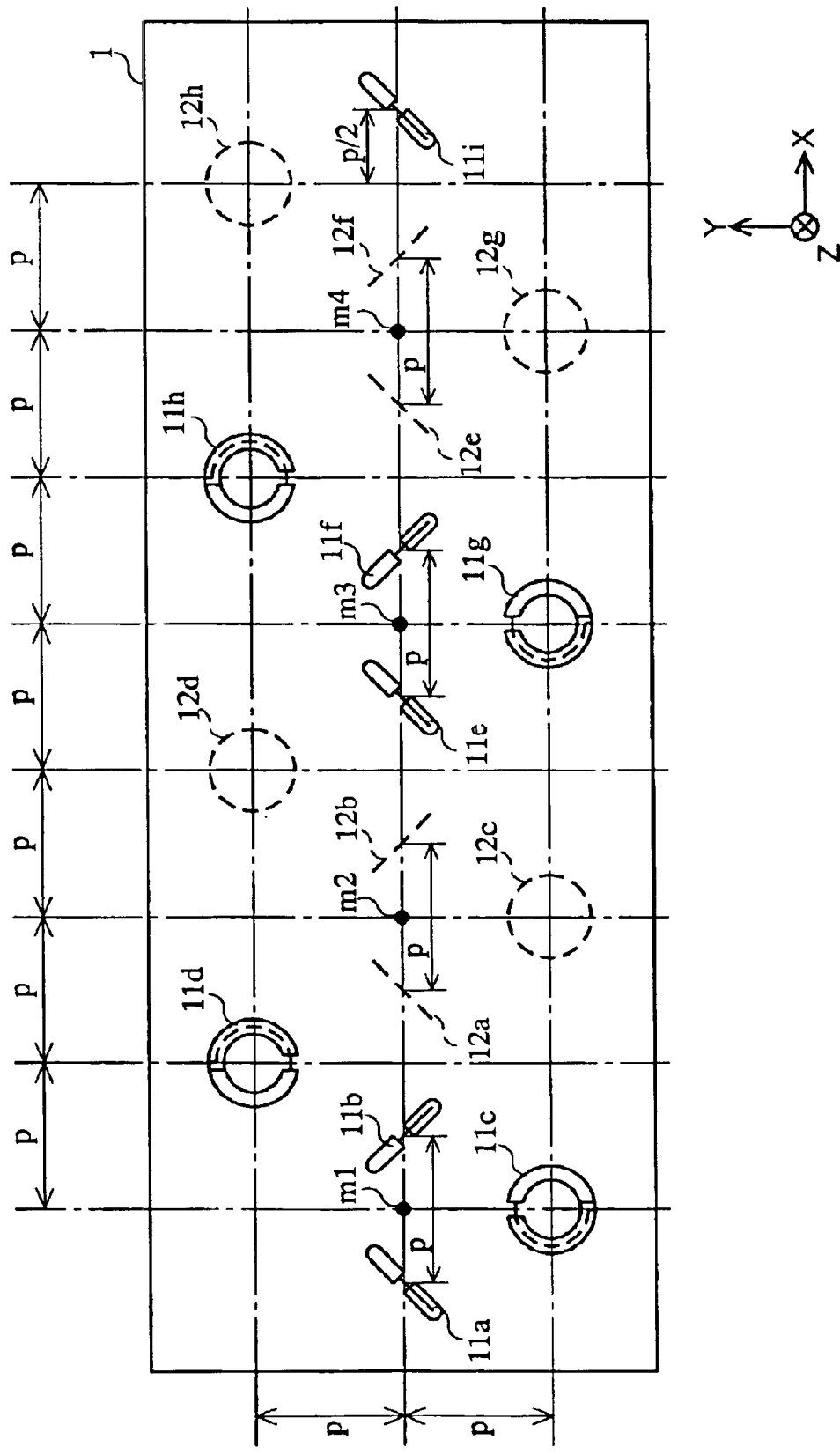
FIG. 15 is a schematic illustration for describing an exemplary loop probe placement of FIG. 13.

Next, with reference to FIG. 15, an exemplary loop probe placement in the electromagnetic probe section 1 will be described. FIG. 15 is a schematic probe placement, which is seen from the positive Z-axis direction (see FIG. 1), for describing the exemplary placement of the loop probes 11 having the above-described shielded structure. As described above, each loop probe 11 is connected to the electromagnetic field level detection section 2 by a transmission line, and is secured to the supporting section 6 by the securing member. In the following descriptions, however, the transmission line and the securing member are omitted in FIG. 15 for the sake of simplicity.

In FIG. 15, the electromagnetic probe section 1 according to the third embodiment has nine loop probes 11a to 11i having the above-described shielded structure, and eight dummy loop probes 12a to 12h. Note that the positions of the loop centers and the loop plane directions of the above nine loop probes 11a to 11i and the above dummy loop probes 12a to 12h are identical to the second embodiment, and therefore the detailed description thereof is hereinafter omitted.

Here, directions of the coaxial tube section 111, the copper wire section 112, and the gap 113, which compose each of the loop probes 11a to 11i, will be described. The loop probes 11a, 11e, and 11i are placed so that the gap 113 is oriented in the negative Z-axis direction, and the coaxial tube section 111 is oriented in a lower left direction. The loop probes 11b and 11f are placed so that the gap 113 is oriented in the negative Z-axis direction, and the coaxial tube section 111 is oriented in a lower right direction. The loop probes 11c and 11g are placed so that the gap 113 is oriented in the positive Y-axis direction, and the coaxial tube section 111 is oriented in the negative X-axis direction. The loop probes 11d and 11h are placed so that the gap 113 is oriented in the negative Y-axis direction, and the coaxial tube section 111 is oriented in the positive X-axis direction.

Figure 16:
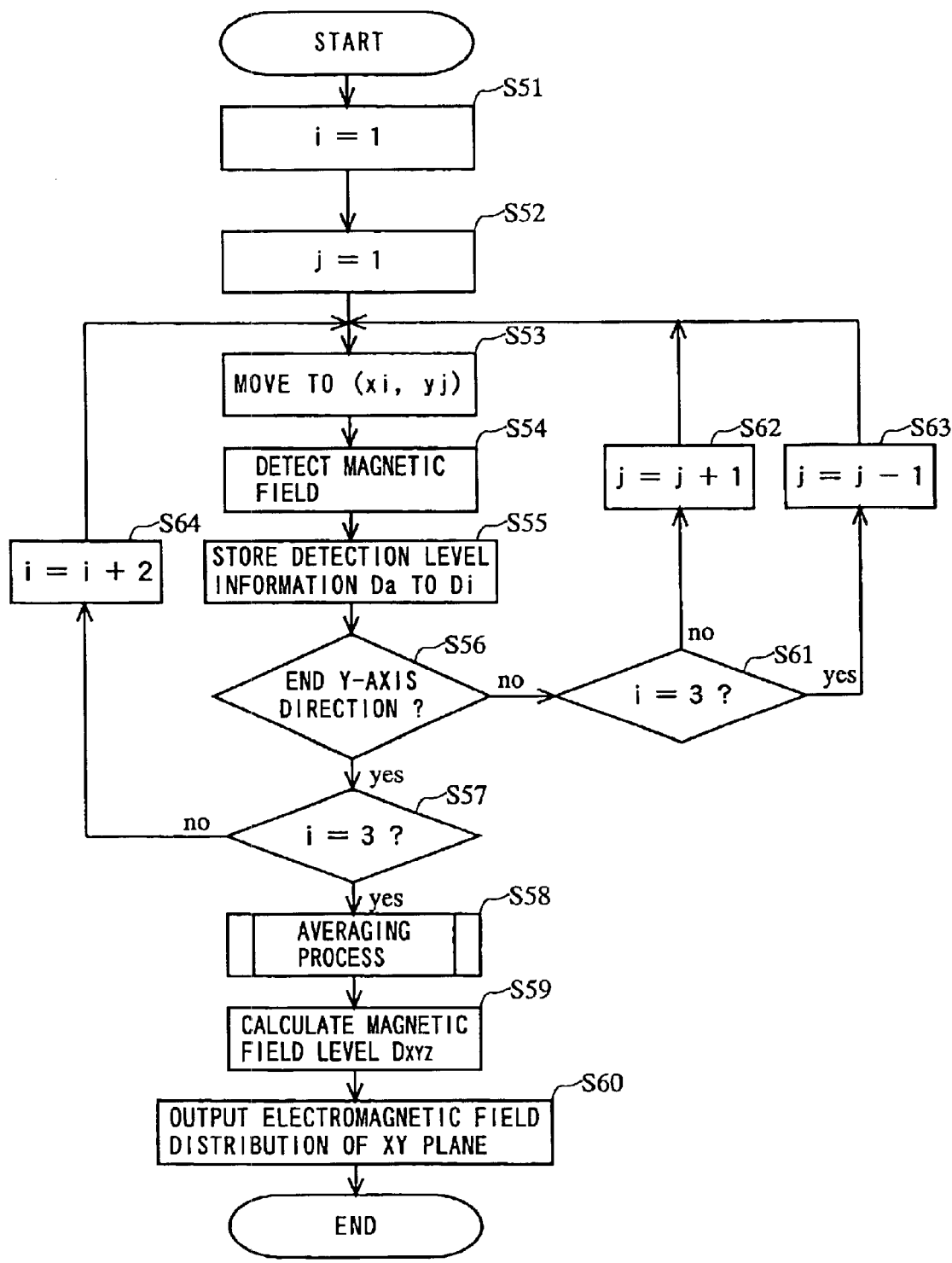
FIG. 16 is a flowchart showing an electromagnetic field distribution calculation process performed by the calculation processing section 3 according to the third embodiment of the present invention.
Figure 17:
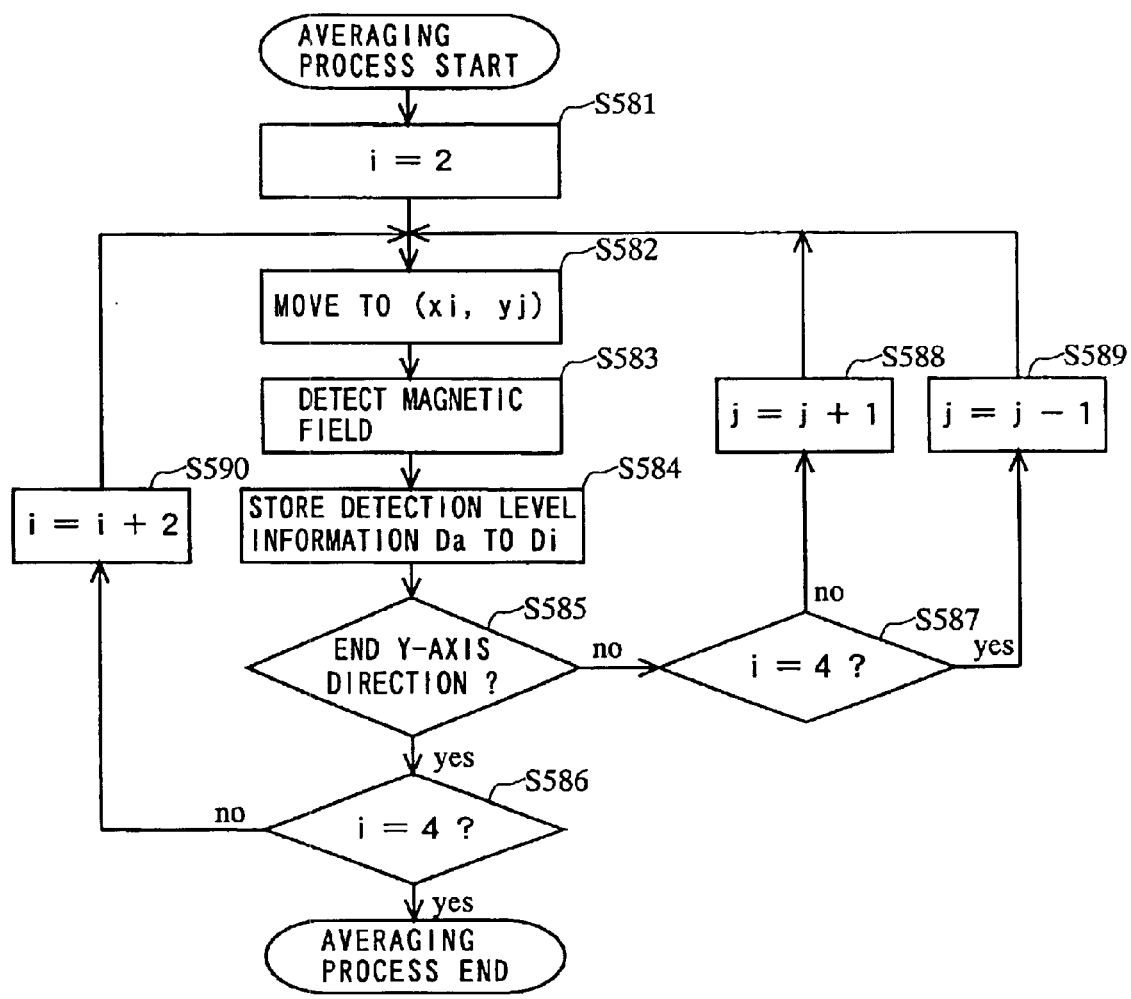
FIG. 17 is a sub-routine showing an averaging process performed in step S58 of FIG. 16.
Figure 18:
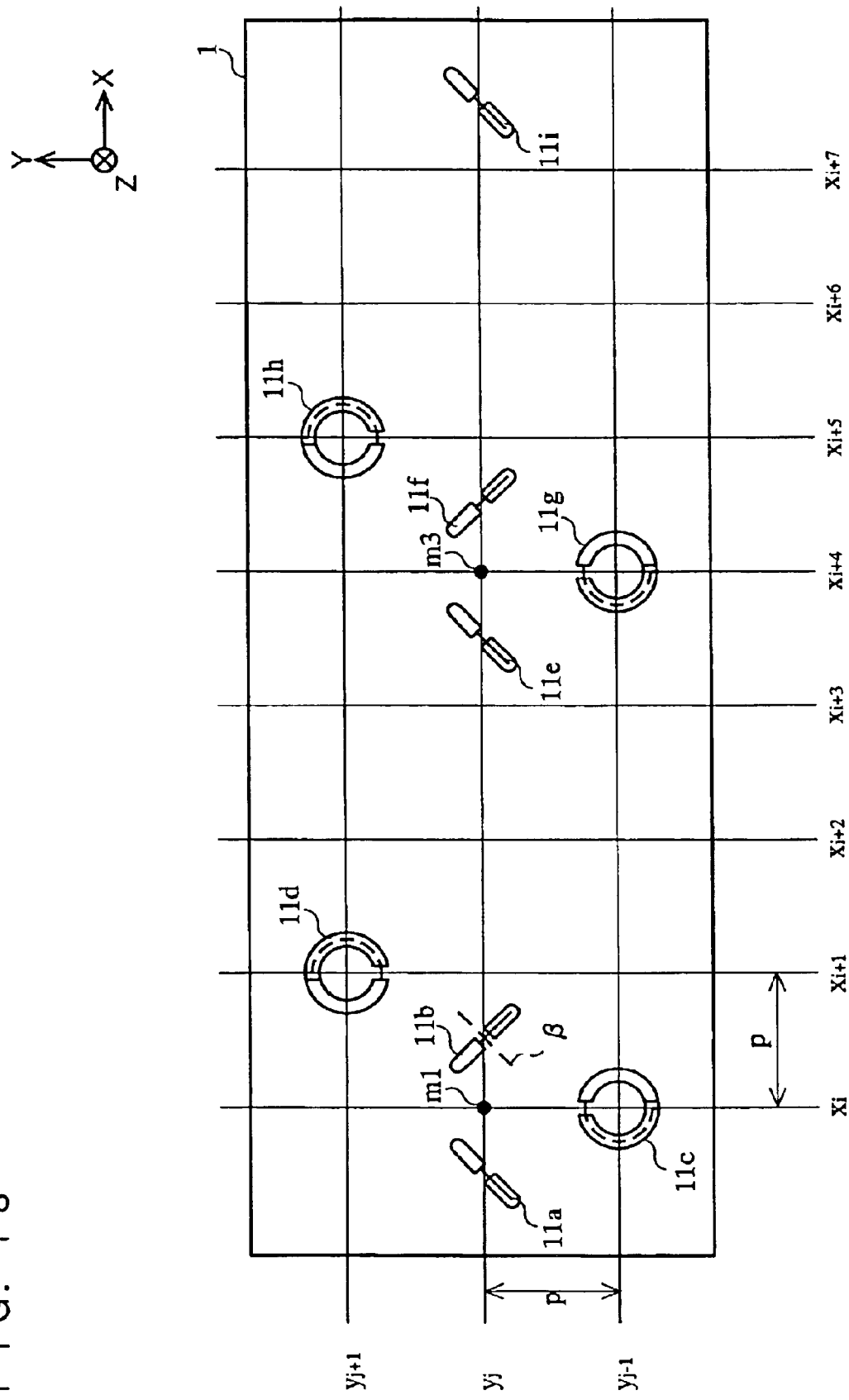
FIG. 18 is a schematic illustration for describing positions of loop probes 11a to 11i when the calculation processing section 3 according to the third embodiment of the present invention moves the object HP.

Next, with reference to FIGS. 16 to 20, an electromagnetic field distribution calculation process performed by the calculation processing section 3 according to the third embodiment will be described. FIG. 16 is a flowchart showing the electromagnetic field distribution calculation process performed by the calculation processing section 3. FIG. 17 is a sub-routine showing an averaging process performed in step S58 of FIG. 16. FIG. 18 is a schematic illustration for describing positions of the loop probes 1a to 11i when the calculation processing section 3 moves the object HP. FIG. 19 is a schematic illustration for describing a positional relationship of the loop probes 11a and 11b in the averaging process. FIG. 20 is an illustration for describing an exemplary data table stored in the storing section 32. Note that it is assumed that the plurality of magnetic field detection probes of the electromagnetic probe section 1 are the above-described nine loop probes 11a to 11i.

When an electromagnetic field distribution of the target HP is measured by the electromagnetic wave measuring apparatus according to the third embodiment, a position (see FIG. 1) of the electromagnetic probe section 1 is previously adjusted in the Z-axis direction so as to be close to the object HP, thereby measuring an electromagnetic field distribution over the XY plane located at a fixed distance in the Z-axis direction. Also, the XY plane is divided by the above-described pitch p on the basis of X- and Y-axis coordinates. The electromagnetic wave measuring apparatus uses coordinates of an intersection point as measurement position coordinates $(x_i, y_j)$ (i and j are natural numbers), and measures a magnetic field level at each measurement position coordinate by moving the table top of the XY table 5.

In FIG. 16, operations performed by the calculation processing section 3 in steps S51 to S54 are the same as the operations in steps S31 to S34, which have been described in the second embodiment, and therefore the detailed description thereof is hereinafter omitted.

Next, the calculation processing section 3 stores the detection level information Da to Di received in step S54 in a predetermined data table provided in the storing section 32 (step S55). In the third embodiment, a method for storing the detection level information Da to Di is the same as the method described in the second embodiment, but the data table provided in the storing section 32 is different from the data table used in the second embodiment.

In FIG. 20, detection level information and magnetic field level are associated with measurement position coordinates and stored in the data table used in the third embodiment. In the data table used in the third embodiment, the detection level information are classified according to a direction of each loop probe 11 detecting the detection level information. Specifically, the detection level information Da, De, and Di, which are detected by the respective loop probes 11a, 11e, and 11i, belong to a first group, and the detection level information Db and Df, which are detected by the respective loop probes 11b and 11f, belong to a second group. The detection level information Dc, Dd, Dg and Dh, which are detected by the respective loop probes 11c, 11d, 11g and 11h, belong to a third group. The data table used in the third embodiment sets storage areas for a first reciprocating movement, in which the target HP is moved in the Y-axis direction with regard to the electromagnetic probe section 1, and also sets storage areas for a second reciprocating movement performed in an averaging process, which will be described below. That is, the detection level information Da to Di are stored in step S55 in the respective areas, which are classified into first to third groups and are associated with the measurement position coordinates, set for the first reciprocating movement. Note that, also in the third embodiment, the loop probes 11a to 11i detect different measurement position coordinates, and the calculation processing section 3 stores the detection level information Da to Di in the areas corresponding to the respective measurement position coordinates in accordance with the reference shown in FIG. 12.

Next, the operations performed by the calculation processing section 3 in steps S56, S57, and S61 to S64 are the same as the operations in steps S36, S37, and S40 to S43, which have been described in the second embodiment using FIG. 9, and therefore the detailed description thereof is hereinafter omitted.

Here, the calculation processing section 3 determines in step S57 whether or not the current temporary variable i is equal to 3. If the current temporary variable i is equal to 3, the calculation processing section 3 proceeds to step S58. Before the above-described step S57, as described in the second embodiment, the electromagnetic probe section 1 moves by pitch p in the outward direction. After reaching a predetermined end point, the electromagnetic probe section 1 moves by pitch 2p in the positive X-axis direction, and performs the homeward movement by pitch p. For example, if the electromagnetic probe section 1 passes through the positions of the loop probes 11a to 11i as shown in FIG. 18 during the outward movement, the midpoints m1 and m3 are shifted, during the homeward movement, on the X-axis coordinates $x_{i+2}$ and $x_{i+6}$, respectively, in the negative Y-axis direction. That is, an area in which the dummy loop probes 12a to 12h are placed in FIG. 15 is measured by the homeward movement, thereby obtaining the detection level information Da to Di of the measurement position coordinates efficiently and properly by outward and homeward movements. Thus, the detection level information Da to Di corresponding to the measurement position coordinates ($x_i$, $y_j$) have already been stored in the above-described storage areas set for the first reciprocating movement, which are shown in FIG. 20.

In step S58, the calculation processing section 3 performs an averaging process. FIG. 17 is a sub-routine showing the averaging process performed in step S58. Hereinafter, with reference to FIG. 17, the averaging process will be described. The electromagnetic probe section 1 performs the second reciprocating movement for the object HP by this averaging process.

In FIG. 17, the calculation processing section 3 sets a temporary variable i, which represents the X-axis coordinate in the flowchart, to 2 (step S581). Next, based on the current temporary variables i and j, the calculation processing section 3 outputs table driving data TD for moving the object HP so that the electromagnetic probe section 1 coincides with the measurement position coordinates ($x_i$, $y_j$), and provides a table driving instruction for the table driving section 4 (step S582). Then, the calculation processing section 3 receives the detection level information Da to Di as magnetic field data on the measurement position coordinates ($x_i$, $y_j$) (step S583). The operations performed by the calculation processing section 3 in steps S582 and S583 are the same as the operations performed in steps S53 and S54 (that is, steps S33 and S34 of FIG. 9, which have been described in the second embodiment).

Here, to be more specific, a position of the electromagnetic prove section 1 in the case where the temporary variable i is equal to 2 will be described. For example, if the electromagnetic probe section 1 passes through the positions of the loop probes 11a to 11i shown in FIG. 18 during the outward movement, the midpoints m1 and m3 are shifted, during the homeward movement in step S53, on the X-axis coordinates $x_{i+2}$ and $x_{i+6}$, respectively. That is, by the first reciprocating movement performed before the averaging process, the midpoint m1 is shifted by pitch p on the X-axis coordinates $x_i$ and $x_{i+2}$ in the Y-axis direction, and the midpoint m3 is shifted by pitch p on the X-axis coordinates $x_{i+4}$ and $x_{i+6}$ in the Y-axis direction. In this averaging process (i=2), the midpoints m1 and m3 are placed on the positions shifted by pitch p from the X-axis coordinates $x_i$ and $x_{i+4}$, respectively, in the positive X-axis direction, that is, the midpoints m1 and m3 are placed on the X-axis coordinates $x_{i+1}$ and $x_{i+5}$, respectively. By a movement in the positive Y-axis direction, which will be described below, the midpoints m1 and m3 are shifted by pitch p on the X-axis coordinates $x_{i+1}$ and $x_{i+5}$, respectively. Furthermore, by a movement in the positive X-axis direction, which will be described below, the midpoints m1 and m3 are placed on the positions shifted by pitch 2p from the X-axis coordinates $x_{i+1}$ and $x_{i+5}$, respectively, in the positive X-axis direction, that is, the midpoints m1 and m3 are placed on the X-axis coordinates $x_{i+3}$ and $x_{i+7}$, respectively, and by a movement in the negative Y-axis direction, the midpoints m1 and m3 are shifted by pitch p on the X-axis coordinates $x_{i+3}$ and $x_{i+7}$, respectively. That is, by the second reciprocating movement performed in this averaging process, the midpoint m1 is shifted by pitch p on the X-axis coordinates $x_{i+1}$ and $x_{i+3}$ in the Y-axis direction, and the midpoint m3 is shifted by pitch p on the X-axis coordinates $x_{i+5}$ and $x_{i+7}$ in the Y-axis direction.

Here, the loop probes 11a and 11b will be described in detail. As described above, the midpoint m1 is shifted by pitch p on the X-axis coordinate $x_i$ during the first outward movement. Thus, the loop probe 11b detects magnetic field components, which are parallel to the XY plane, of the measurement position coordinates ($x_i$, $y_j$) and ($x_{i+1}$, $y_j$). On the other hand, the midpoint m1 is shifted by pitch p on the X-axis coordinate $x_{i+1}$, during the second outward movement. Thus, the loop probe 11a detects magnetic field components, which are parallel to the XY plane, of the same measurement position coordinates ($x_i$, $y_j$) and ($x_{i+1}$, $y_j$). That is, while the loop probe 11a measures the magnetic field component in the second outward movement, a loop center of the loop probe 11a coincides with a loop center of the loop probe 11b in the first outward movement (see a dashed line β in FIG. 18).

With reference to FIG. 19, overlapping of the measurement position coordinates of the loop probes 11a and 11b will be described in detail. FIG. 19 illustrates the loop probe 11$b$ in the first outward movement and the loop probe 11$a$, which is shown in a dashed line, in the second outward movement, which are placed between the measurement position coordinates ($x_1$, $y_1$) and ($x_2$, $y_1$). As shown in FIG. 19, in the case of the loop probe 11$b$ in the first outward movement, a copper wire section 112$b$ lies close to the measurement position coordinates ($x_1$, $y_1$), and a coaxial tube section 111$b$ lies close to the measurement position coordinates ($x_2$, $y_1$). On the other hand, in the case of the loop probe 11$a$ in the second outward movement, a coaxial tube section 111$a$ lies close to the measurement position coordinates ($x_1$, $y_1$), and a copper wire section 112$a$ lies close to the measurement position coordinates ($x_2$, $y_1$). As described above, the loop probe 11$b$ in the first outward movement and the loop probe 11$a$ in the second outward movement detect the magnetic field components, which are parallel to the XY plane, of the same measurement position coordinates ($x_1$, $y_1$) and ($x_2$, $y_1$). However, the coaxial tube sections 111$b$ and 111$a$ are axisymmetric with respect to a perpendicular line passing through an intersection of the loop probes 11$a$ and 11$b$. Thus, the aforementioned asymmetry of the loop probe 11 is cancelled by performing an averaging process for the detection level information Db and Da detected by the loop probe 11$b$ in the first outward movement and the loop probe 11$a$ in the second outward movement, respectively, whereby it is possible to obtain high-precision magnetic field level data on the measurement position coordinates ($x_1$, $y_1$) and ($x_2$, $y_1$).

Overlapping of the measurement position coordinates ($x_i$, $y_j$) also happens among the other loop probes. When the magnetic field component parallel to the XY plane is detected, overlapping of the measurement position coordinates ($x_i$, $y_j$) happens among the loop probes 11$a$, 11$e$, and 11$i$, and between the loop probes 11$b$ and 11$f$. On the other hand, when the magnetic field component in the Z-axis direction is detected, overlapping of the measurement position coordinates ($x_i$, $y_j$) happens between the loop probes 11$c$ and 11$g$, and the loop probes 11$d$ and 11$h$. In each case, the coaxial tube section 111, the copper wire section 112, and the gap 113 of the respective loop probes 11$a$ to 11$i$ are placed in directions as shown in FIG. 15, whereby asymmetry of the detection level information Da to Di is cancelled by an averaging process. As a result, it is possible to obtain high-precision magnetic field data.

Hereinafter, the flowchart of FIG. 17 will be described again. The calculation processing section 3 stores the detection level information Da to Di received in step S583 in the above-described data table provided in the storing section 32 (step S584). A method for storing the detection level information Da to Di in the data table in step S584 differs from the method described in step S55 in that the detection level information Da to Di are written into different storage areas. Instep S584, the detection level information Da to Di are stored in the respective areas, which are classified into first to third groups and are associated with the measurement position coordinates, set for the second reciprocating movement. Note that, also in step S584, the loop probes 11$a$ to 11$i$ detect different measurement position coordinates, and the calculation processing section 3 stores the detection level information Da to Di in the areas corresponding to the respective measurement position coordinates in accordance with the reference shown in FIG. 12.

Next, the calculation processing section 3 determines whether or not measurement in the Y-axis direction is completed with respect to the current X-axis coordinate $x_i$(step S585). If the measurement in the Y-axis direction is not completed with respect to the current X-axis direction coordinate $x_i$, the calculation processing section 3 proceeds to step S587. If the measurement in the Y-axis direction is completed with respect to the current X-axis direction coordinate $x_i$, the calculation processing section 3 proceeds to step S586.

In step S587, the calculation processing section 3 determines whether or not the current temporary variable i is equal to 4. If the current temporary variable i is not equal to 4, the calculation processing section 3 proceeds to step S588. If the current temporary variable i is equal to 4, the calculation processing section 3 proceeds to step S589.

In step S588, the calculation processing section 3 increments the temporary variable j by +1, and goes back to step S582 for repeating the process. The calculation processing section 3 executes the above-described step S582 after executing the above-described step S588, thereby moving the table top of the XY table 5 by pitch p in the negative Y-axis direction. That is, the electromagnetic probe section 1 moves by pitch p in the positive Y-axis direction with respect to the measurement position coordinates. This movement corresponds to a second outward movement.

On the other hand, the calculation processing section 3 decrements the temporary variable j by −1, and goes back to step S582 for repeating the process. The calculation processing section 3 executes the above-described step S582 after executing the above-described step S589, thereby moving the table top of the XY table 5 by pitch p in the positive Y-axis direction. That is, the electromagnetic probe section 1 moves by pitch p in the negative Y-axis direction with respect to the measurement position coordinates. This movement corresponds to a second homeward movement.

In step S586, the calculation processing section 3 determines whether or not the current temporary variable i is equal to 4. If the current temporary variable i is not equal to 4, the calculation processing section 3 proceeds to step S590. If the current temporary variable i is equal to 4, the calculation processing section 3 ends the process of the flowchart, and proceeds to step S59 of FIG. 16.

In step S590, the calculation processing section increments the temporary variable i by +2, and goes back to step S582 for repeating the process. The calculation processing section 3 executes the above step S582 after executing the above step S590, thereby moving the table top of the XY table 5 by pitch 2$p$ in the negative X-axis direction. That is, the electromagnetic probe section 1 moves by pitch 2$p$ in the positive X-axis direction with respect to the measurement position coordinates.

Here, the above-described steps S590 and S589 will be described in detail. As described above, in step S589, a process for performing the homeward movement, in which the electromagnetic probe section 1 moves by pitch p in the negative Y-axis direction with respect to the measurement position coordinates, is performed after execution of step S590. That is, the electromagnetic probe section 1 performs the second outward movement by pitch p. After reaching a predetermined end point, the electromagnetic probe section 1 moves by pitch 2$p$ in the positive X-axis direction, and performs the second homeward movement by pitch p. For example, if the electromagnetic probe section 1 passes through the positions of the loop probes 11$a$ to 11$i$ shown in FIG. 18 during the first outward movement, the midpoints m1 and m3 are shifted, during the second homeward movement, on the X-axis coordinates $x_{i+3}$ and $x_{i+7}$, respectively, in the negative Y-axis direction. That is, in the second reciprocating movement in the averaging process, the electromagnetic probe section 1 moves, with respect to the object HP, on the coordinates shifted by pitch p in the positive X-axis direction from the coordinates measured in the first reciprocating movement. Thus, in the case of the measurement position coordinates at which the detection level information Da to Di are measured in the first reciprocating movement, most of the above measurement position coordinates are measured again in the second reciprocating movement for obtaining the detection level information Da to Di. Note that the detection level information encircled in a double line, as shown in FIG. 20, is measured by the second homeward movement.

Hereinafter, the flowchart of FIG. 16 will be described again. In step S59, the calculation processing section 3 calculates a magnetic field level $D_{XYZ}$ using the detection level information Da to Di written into the storage areas, which are set for the first and second reciprocating movements, in the data table stored in the storing section 32. The magnetic field level $D_{XYZ}$ represents an XYZ axis component, that is, a three-dimensional magnetic field level. For the sake of simplification of descriptions, as shown at the bottom of FIG. 20, in the storage areas set for the first reciprocating movement, the detection level information Da $(x_i, y_j)$, De $(x_i, y_j)$, and Di $(x_i, y_j)$, which belong to the first group, are collectively defined as detection level information $D_{X1}(x_i, y_j)$, the detection level information Db $(x_i, y_j)$ and Df $(x_i, y_j)$, which belong to the second group, are collectively defined as detection level information $D_{Y1}, (x_i, y_j)$, and the detection level information Dc $(x_i, y_j)$, Dd $(x_i, y_j)$, Dg $(x_i, y_j)$, and Dh $(x_i, y_j)$, which belong to the third group, are collectively defined as detection level information $D_{Z1}$ $(x_i, y_j)$. Also, in the storage areas set for the second reciprocating movement, the detection level information Da $(x_i, y_j)$, De $(x_i, y_j)$, and Di $(x_i, y_j)$, which belong to the first group, are collectively defined as detection level information $D_{X2}$ $(x_i, y_j)$, the detection level information Db $(x_i, y_j)$ and Df $(x_i, y_j)$, which belong to the second group, are collectively defined as detection level information $D_{Y2}$ $(x_i, y_j)$, and the detection level information Dc $(x_i, y_j)$, Dd $(x_i, y_j)$, Dg $(x_i, y_j)$, and Dh $(x_i, y_j)$, which belong to the third group, are collectively defined as detection level information $D_{Z2}$ $(x_i, y_j)$.

The calculation processing section 3 calculates the average of the magnetic field level $D_{XYZ}$ $(x_i, y_j)$, the detection level information $D_{X1}$ $(x_i, y_j)$, and the detection level information $D_{X2}$ $(x_i, y_j)$, the average of the magnetic field level $D_{XYZ}$ $(x_i, y_j)$, the detection level information $D_{Y1}$ $(x_i, y_j)$, and the detection level information $D_{Y2}$ $(x_i, y_j)$, and the average of the magnetic field level $D_{XYZ}$ $(x_i, y_j)$, the detection level information $D_{Z1}$ $(x_i, y_j)$, and the detection level information $D_{Z2}$ $(x_i, y_j)$ (detection level information $D_{X1}$ $(x_i, y_j)$, $D_{X2}$ $(x_i, y_j)$, $D_{Y1}$ $(x_i, y_j)$, $D_{Y2}$ $(x_i, y_j)$, $D_{Z1}$ $(x_i, y_j)$, and $D_{Z2}$ $(x_i, y_j)$ are associated with the measurement position coordinates $(x_i, y_j)$, and stored in the data table). Then, the calculation processing section 3 calculates the magnetic field level $D_{XYZ}$ $(x_i, y_j)$ using the root sum square of the above three averages. That is, the calculation processing section 3 sequentially calculates all the magnetic field levels $D_{XYZ}$ $(x_i, y_j)$ by the following equation:
[Equation 3]

$$D_{XYZ}(x_i, y_j) = \sqrt{\left\{\frac{D_{X1}(x_i, y_j) + D_{X2}(x_i, y_j)}{2}\right\}^2 + \left\{\frac{D_{Y1}(x_i, y_j) + D_{Y2}(x_i, y_j)}{2}\right\}^2 + \left\{\frac{D_{Z1}(x_i, y_j) + D_{Z2}(x_i, y_j)}{2}\right\}^2} \quad (3)$$

Then, the calculation processing section 3 stores the calculating results in the data table of the storing section 32.

As shown in FIG. 20, at measurement coordinates $x_1$ and $x_9$ at the respective ends in the X-axis direction, there is a shortage of data for performing an averaging process in the above-described calculation of the magnetic field level $D_{XYZ}$. The calculation of the magnetic field level $D_{XYZ}$ may not be performed for measurement position coordinates $(x_i, y_j)$ including the measurement coordinates $x_1$ and $x_9$, the calculation of the magnetic field level $D_{XYZ}$ may be performed using the above-described equation (3) by interpolating data by a predetermined interpolating process, or the calculation of the magnetic field level $D_{XYZ}$ may be performed using the above-described equation (2) used in the second embodiment.

Next, the calculation processing section 3 calculates an magnetic field distribution over the measured XY plane using the magnetic field level $D_{XYZ}$ at each measurement position coordinate stored in the storing section 32, outputs the calculated magnetic field distribution to an output device (not shown) (step S60), and ends the process of the flowchart.

As described above, the magnetic field level $D_{XYZ}$ represents a three-dimensional magnetic field level at each measurement position coordinate, whereby it is possible to calculate a high-precision magnetic field distribution of the object HP. Also, according to the electromagnetic wave measuring apparatus of the third embodiment, data obtained by the loop probes having the above-described shielded structure is averaged by two reciprocating movements, whereby a high-precision magnetic field distribution can be obtained over a wide range of areas with limited influence from the electric fields. For the above-described averaging process, the electromagnetic probe section 1 is only required to move by pitch 2p in the X-axis direction, thereby realizing size reduction of a driving system device for moving the table on which the object HP is mounted.

In the above-described third embodiment, the electromagnetic probe section 1 moves with respect to the object HP in the X- and Y-axis directions in the first and second reciprocating movements as follows: moving by pitch p in the positive Y-axis direction (first outward movement)→moving by pitch 2p in the positive X-axis direction→moving by pitch p in the negative Y-axis direction (first homeward movement)→moving by pitch p in the negative X-axis direction→moving by pitch p in the positive Y-axis direction (second outward movement)→moving by pitch 2p in the positive X-axis direction→moving by pitch p in the negative Y-axis direction (second homeward movement). However, the movement in the X- and Y-axis directions is not limited thereto. For example, the electromagnetic probe section 1 may move with respect to the object HP in the X- and Y-axis directions in the first and second reciprocating movements as follows: moving by pitch p in the positive Y-axis direction (first outward movement)→moving by pitch p in the positive X-axis direction→moving by pitch p in the negative Y-axis direction (first homeward movement)→moving by pitch p in the positive X-axis direction→moving by pitch p in the positive Y-axis direction (second outward movement) →moving by pitch p in the positive X-axis direction→moving by pitch p in the negative Y-axis direction (second homeward movement). In this case, the detection level information Da to Di measured in the above-described first and second outward movements are stored in the storage areas set for the first reciprocating movement in the data table shown in FIG. 20, and the detection level information Da to Di measured in the above-described first and second homeward movement are stored in the storage areas set for the second reciprocating movement in the data table shown in FIG. 20, whereby it is possible to calculate the magnetic field level $D_{XYZ}$ in a similar manner as that described above.

Also, in the above-described third embodiment, measurement of electromagnetic waves is completed by two reciprocating movements. However, after the above two reciprocating movements, similar measurement operations may be continued by changing the position of the object HP in order to measure electromagnetic waves in different areas in the positive X-axis direction.

With reference to FIG. 21, electromagnetic field distribution characteristics obtained by the electromagnetic wave measuring apparatus of the present invention will be described. FIG. 21 is a graph showing the electromagnetic field distribution characteristics obtained by the electromagnetic wave measuring apparatus.

In FIG. 21, an experimental model for verifying the magnetic field distribution characteristics obtained by the electromagnetic wave measuring apparatus measures a magnetic field distribution at 2 GHz using the λ/2 dipole antenna ANT as shown in FIG. 14A. The above-described experimental model compares the magnetic field distribution characteristics (in FIG. 21, denoted as "three directions") measured by the loop probes using three planes perpendicular to each other as their loop planes, which have been described in the first and second embodiments, the magnetic field distribution characteristics (in FIG. 21, denoted as "average of three directions") measured as a result of an averaging process by the loop probes using three planes perpendicular to each other as their loop planes, which have been described in the third embodiment, and the magnetic field distribution characteristics (in FIG. 21, denoted as "two directions") measured by the loop probes using two planes perpendicular to each other as their loop planes, which are conventional loop probes. In this case, loop probes are moved up and down in FIG. 14A so as to move across the dipole antenna ANT, thereby obtaining a relative value of magnetic intensity at each coordinate.

The electromagnetic wave measuring apparatus of the present invention detects a three-dimensional magnetic field component of the electromagnetic waves. Thus, as shown in FIG. 21, the electromagnetic wave measuring apparatus of the present invention shows the magnetic field distribution characteristics to be closer to the theoretical values compared to a conventional electromagnetic wave measuring apparatus. As a result, the electromagnetic wave measuring apparatus of the present invention can obtain a magnetic field distribution characteristics with higher-precision than the conventional electromagnetic wave measuring apparatus. Also, the magnetic field distribution characteristics for which the averaging process is performed approximately coincide with the theoretical values, whereby magnetic field distribution characteristics with much higher-precision can be obtained by the averaging process.

In the above-described first to third embodiments, a three-dimensional magnetic field level is measured using detection level information in three directions. However, it is to be understood that a direction of the magnetic field at measurement position coordinates can be calculated using a direction and level of the magnetic field component, which are indicated by the detection level information in three directions.

Also, in the above-described first to third embodiments, the object HP is moved by the XY table 5 based on the measurement position coordinates. However, the electromagnetic probe section 1 may be moved around over the object HP. Also, the object HP and the electromagnetic probe section 1 may not be moved automatically by the calculation processing section 3. For example, the object HP and the electromagnetic probe section 1 may be moved manually by a user.

Furthermore, the table top of the XY table 5 may be structured to be movable in the Z-axis direction, thereby allowing the calculation processing section 3 to measure an electromagnetic field distribution at predetermined spacings also in the Z-axis direction.

The magnetic field level calculated by the electromagnetic wave measuring apparatus of the present invention represents a three-dimensional magnetic field level at each measurement position coordinate, whereby it is possible to calculate with high-precision the electromagnetic field distribution of the object HP. Also, loop planes of a plurality of loop probes of the electromagnetic wave measuring apparatus are formed so as to be perpendicular to each other, and each loop probe is placed so as not to be interfered with by other loop probes. Thus, it is possible to minimize the occurrence of coupling between the adjacent loop probes.

Also, the electromagnetic wave measuring apparatus of the present invention can calculate an electromagnetic field distribution of eight measurement position coordinates, which are provided in one direction, by one reciprocating movement. Also, a three-dimensional electromagnetic field distribution over a wide range of areas can be measured by nine loop probes, whereby the structure of the apparatus can be simplified. As a result, it is possible to realize substantial cost reduction. Furthermore, a wide range of areas can be measured by a short movement in one direction, whereby it is possible to realize size reduction of the driving system device.

Also, according to the electromagnetic wave measuring apparatus of the present invention, it is possible to measure a high-precision magnetic field distribution with limited influence from the electric fields by averaging data, which is obtained by the loop probe having a shielded structure, by two reciprocating movements. This averaging process requires only a short movement in one direction, whereby it is possible to realize size reduction of the driving system device.

While the invention has been described in detail, the foregoing description is in all aspects illustrative and not restrictive. It is understood that numerous other modifications and variations can be devised without departing from the scope of the invention.

What is claimed is:

1. An electromagnetic wave measuring apparatus comprising:

an electromagnetic probe section at least integrally including a first loop probe forming a first loop plane, a second loop probe forming a second loop plane perpendicular to the first loop plane, and a third loop probe forming a third loop plane perpendicular to the first and second loop planes;

a stage section, on which an object to be measured is mounted, for placing the object to be measured under the electromagnetic probe section;

a driving section operable to cause a movement of at least one of the electromagnetic probe section and the stage section relative to the other;

an electromagnetic wave level generating section at least including first to third generating sections operable to detect induced electric signals from the respective first to third loop probes, and operable to generate first to third electromagnetic field level information indicating intensities of electromagnetic waves perpendicular to the respective first to third loop planes; and a calculation processing section operable to calculate three-dimensional electromagnetic field level information indicating intensities of three-dimensional electromagnetic waves by calculating a root sum square of the first to third electromagnetic field level information generated by the electromagnetic wave level generating section.

2. An electromagnetic wave measuring apparatus comprising:

an electromagnetic probe section at least integrally including a first loop probe forming a first loop plane, a second loop probe forming a second loop plane perpendicular to the first loop plane, and a third loop probe forming a third loop plane perpendicular to the first and second loop planes;

a stage section, on which an object to be measured is mounted, for placing the object to be measured under the electromagnetic probe section;

a driving section operable to cause a movement of at least one of the electromagnetic probe section and the stage section relative to the other;

an electromagnetic wave level generating section at least including first to third generating sections operable to detect induced electric signals from the respective first to third loop probes, and operable to generate first to third electromagnetic field level information indicating intensities of electromagnetic waves perpendicular to the respective first to third loop planes; and a calculation processing section operable to calculate three-dimensional electromagnetic field level information indicating intensities of three-dimensional electromagnetic waves based on the respective electromagnetic field level information generated by the electromagnetic wave level generating section, wherein the first and second loop probes are placed so that loop centers of the first and second loop probes are away from each other by a predetermined pitch with respect to a first direction parallel to a stage plane of the stage section on which the object to be measured is mounted, and the first and second loop planes are formed so as to be at a 45-degree angle with a segment connecting the loop centers of the first and second loop probes and to be perpendicular to the object to be measured, and the third loop probe, which is parallel to the object to be measured, is placed outside of a magnetic field detection space of the first and second loop probes, and a loop center thereof is away from a midpoint of the segment connecting the loop centers of the first and second loop probes by the predetermined pitch in a second direction, which is perpendicular to the first direction and is parallel to the object to be measured.

3. The electromagnetic wave measuring apparatus according to claim 2, wherein the electromagnetic probe section further integrally includes:

a fourth loop probe forming a fourth loop plane parallel to the third loop plane, whose loop center is placed in a position away from the midpoint by the predetermined pitch in the second direction so as to be opposite to a position of the third loop probe with respect to the midpoint, and away therefrom by the predetermined pitch in the first direction; and fifth to eighth loop probes forming fifth to eighth loop planes, respectively, parallel to the corresponding first to fourth loop planes, which are included in another set of loop probes corresponding to a set of the first to fourth loop probes, and are placed in positions away from the respective first to fourth loop probes at a fourfold distance of the predetermined pitch in the first direction, and the electromagnetic wave level generating section further includes fourth to eighth generating sections operable to detect induced electric signals detected by the fourth to eighth loop probes, and operable to generate fourth to eighth electromagnetic field level information indicating intensities of electromagnetic waves perpendicular to the respective fourth to eighth loop planes.

4. The electromagnetic wave measuring apparatus according to claim 3, wherein the electromagnetic probe section further integrally includes a ninth loop probe forming a ninth loop plane parallel to the fifth loop plane, whose loop center is placed in a position away from a loop center of the fifth loop probe at a fourfold distance of the predetermined pitch in the first direction with respect to the sixth loop probe, and the electromagnetic wave level generating section further includes a ninth generating section operable to detect an induced electric signal detected by the ninth loop probe, and operable to generate ninth electromagnetic field level information indicating intensities of electromagnetic waves perpendicular to the ninth loop plane.

5. The electromagnetic wave measuring apparatus according to claim 4, wherein the electromagnetic probe section further integrally includes first and second groups of dummy loop probes which are unconnected to each other and are placed in positions away from the first to fourth loop probes at twofold and sixfold distances, respectively, of the predetermined pitch in the first direction, each group of which has a same positional relationship and structure of the first to fourth loop probes.

6. The electromagnetic wave measuring apparatus according claim 4, wherein each of the first to ninth loop probes has a semicircle of a loop circle as a feeding point, the first, second, fifth, sixth, and ninth loop probes are placed so that feeding points thereof face a same side with respect to the second direction, and the third and seventh loop probes are placed so that the feeding points thereof are oriented in one direction, and the fourth and eighth loop probes are placed so that the feeding points thereof are orientated in a direction opposite to the direction in which the feeding points of the third and seventh loop probes are oriented.

7. The electromagnetic wave measuring apparatus according to claim 6, wherein the feeding point is formed in each of the first to ninth loop probes by bending a portion of a coaxial tube, which is connected to the electromagnetic wave level generating section, into a semicircle of the loop circle, wherein another semicircle of the loop circle is composed of copper wire, and one end of the coaxial tube and one end of the copper wire are essentially connected by a core wire of the coaxial tube.

8. An electromagnetic wave measuring method comprising:

detecting a first induced electric signal using a first loop probe forming a first loop plane;

detecting a second induced electric signal using second loop probe forming a second loop plane perpendicular to the first loop plane;

detecting a third induced electric signal using a third loop probe forming a third loop plane perpendicular to the first and second loop planes;

generating first to third electromagnetic field level information indicating intensities of electromagnetic waves perpendicular to the respective first to third loop planes using the detected first to third induced electric signals; and calculating three-dimensional electromagnetic field level information indicating intensities of three-dimensional electromagnetic waves based on the generated first to third electromagnetic field level information, wherein said calculating calculates the three-dimensional electromagnetic field level information by calculating a root sum square of the first to third electromagnetic field level information.

9. The electromagnetic wave measuring method according to claim 8, further comprising:

causing relative movement of the first to third loop probes and an object to be measured at least in a first measurement direction parallel to the object to be measured; and storing the first to third electromagnetic field level information in accordance with position coordinates of electromagnetic waves, which are detected by the first to third loop probes with respect to the object to be measured, at each change of a positional relationship between the object to be measured and the first to third loop probes, wherein said calculating selects the first to third electromagnetic field level information associated with the same position coordinates stored during said storing, and calculates the three-dimensional electromagnetic field level information with respect to the position coordinates.

10. The electromagnetic wave measuring method according to claim 9, wherein the first and second loop probes are placed so that loop centers of the first and second loop probes are away from each other by a predetermined pitch with respect to a second measurement direction perpendicular to the first measurement direction, and the first and second loop planes are formed so as to be at a 45-degree angle with a segment connecting the loop centers of the first and second loop probes and to be perpendicular to the object to be measured, the third loop probe, which is parallel to the object to be measured, is placed outside of a magnetic field detection space of the first and second loop probes, and a loop center thereof is away from a midpoint of the segment connecting the loop centers of the first and second loop probes by the predetermined pitch in the first measurement direction, and said causing causes relative movement of the object to be measured and the first to third loop probes by the predetermined pitch in the first measurement direction.

11. The electromagnetic wave measuring method according to claim 10, further comprising detecting a fourth induced electric signal using a fourth loop probe forming a fourth loop plane parallel to the third loop plane, which is placed in a position away from the midpoint by the predetermined pitch in the first measurement direction so as to be opposite to a position of the third loop probe with respect to the midpoint, and away therefrom by the predetermined pitch in the second measurement direction, and wherein each of the first to fourth loop probes has a semicircle of a loop circle as a feeding point, the first and second loop probes are placed so that feeding points thereof face a same side with respect to the first measurement direction, the third and fourth loop probes are placed so that the feeding points thereof are oriented in opposite directions, said causing causes relative movement, which is an outward or homeward movement, of the object to be measured and the first to fourth loop probes by the predetermined pitch in the first measurement direction every time the object to be measured and the first to fourth loop probes are shifted by the predetermined pitch in the second measurement direction, said generating further detects the fourth induced electric signal, and generates fourth electromagnetic field level information indicating intensities of electromagnetic waves perpendicular to the fourth loop plane, said storing further stores the fourth electromagnetic field level information in accordance with position coordinates of electromagnetic waves, which are detected by the fourth loop probe with respect to the object to be measured, at each change of a positional relationship between the object to be measured and the first to fourth loop probes, and said calculating selects the first to fourth electromagnetic field level information associated with the same position coordinates stored during said storing, and calculates the three-dimensional electromagnetic field level information after averaging the first to fourth electromagnetic field level information indicating magnetic field components in a same direction with respect to the position coordinates.

* * * * *